(12) United States Patent
D'Angelo

(10) Patent No.: US 6,621,284 B2
(45) Date of Patent: Sep. 16, 2003

(54) POST-PACKAGE TRIMMING OF ANALOG INTEGRATED CIRCUITS

(75) Inventor: Kevin P. D'Angelo, Santa Clara, CA (US)

(73) Assignee: Advanced Analogic Technologies, Inc., Sunnyvale, CA (US)

( * ) Notice: Subject to any disclaimer, the term of this patent is extended or adjusted under 35 U.S.C. 154(b) by 195 days.

(21) Appl. No.: 09/927,971

(22) Filed: Aug. 9, 2001

(65) Prior Publication Data

US 2003/0038649 A1 Feb. 27, 2003

(51) Int. Cl.$^7$ ............................................. G01R 31/02
(52) U.S. Cl. ..................... 324/763; 324/158.1; 365/350
(58) Field of Search .................... 324/765, 764, 324/763, 605, 606, 647, 76.63, 158.1; 365/225.7, 201, 96, 189.01; 257/204, 350; 714/766, 764, 773; 438/112, 124, 126, 197

(56) References Cited

U.S. PATENT DOCUMENTS 5,263,031 A * 11/1993 Inoue ........................ 371/40.1

6,240,033 B1 * 5/2001 Yang et al. ............... 635/225.7

* cited by examiner

Primary Examiner—Kamand Cuneo
Assistant Examiner—Trung Nguyen
(74) Attorney, Agent, or Firm—Silicon Valley Patent Group LLP

(57) ABSTRACT

Circuits and methods to trim analog integrated circuits, such as five-pin linear voltage regulators, after packaging are disclosed. In an exemplary embodiment, a test mode input circuit determines establishment of a test mode operation of the analog integrated circuit. A register control circuit generates a data signal and a plurality of control signals. A register circuit, including an input shift register and a plurality of storage devices, receives the data signal and the control signals, programs the storage devices as directed, and generates a plurality of trim control signals based on the states of the storage devices. A trim control circuit applies the trim control signals to modify a normal operation of the packaged analog integrated circuit. The analog integrated circuit and the circuits to trim the analog integrated circuit may be included in a same package.

30 Claims, 14 Drawing Sheets

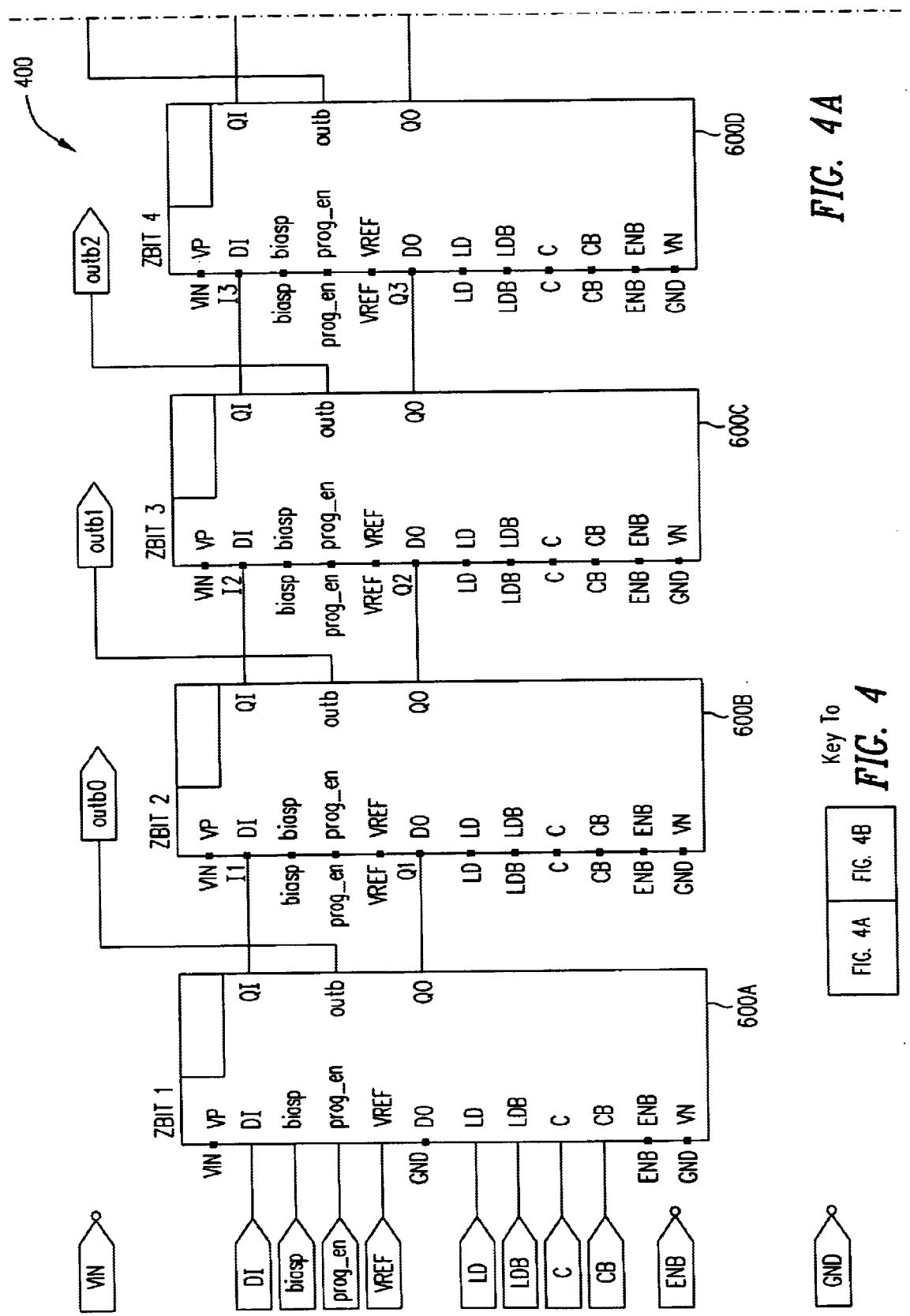

POST-PACKAGE TRIMMING OF ANALOG INTEGRATED CIRCUITS

FIELD OF THE INVENTION

This invention relates to precision trimming of analog integrated circuits (ICs) after packaging and in particular to trimming linear voltage regulators after packaging.

BACKGROUND

Analog integrated circuits (ICs), including linear voltage regulators, often require precision trimming after fabrication. Trimming generally involves changing resistance values to change voltage or current levels. For example, trimming is often performed to cancel process variation among wafers, since voltage tolerances on the order of +/−0.5% are required of today's technologies. Alternatively, multiple options (e.g., voltage levels output by a linear regulator) may be fabricated into a single IC, where one such option must be chosen based on a given customer's requirements. Selection of the desired option for each customer is accomplished by trimming. Trimming allows batch processing of many ICs at once, using a single fabrication process, with customization performed toward the end of the fabrication process.

Typical methods of trimming include blowing fuseable links, burning zener diodes, and laser trimming resistors. Trimming is usually performed on each die at the wafer level, during wafer sort, before the die are packaged. The main function of the wafer sort step, in addition to trimming, is to identify working die for packaging.

Trimming analog ICs at the wafer level has several disadvantages. First, it can be expensive and time consuming. If a product has a high yield, it is desirable to forego wafer sort and proceed directly to packaging to save the cost and time of wafer sort. However, the necessity of trimming precludes this. Second, trimming at the wafer level often results in package shift. Package shift occurs when the value of the trimmed parameter shifts when the die is packaged. Accordingly, an improved, more reliable trimming technique is desirable.

SUMMARY

In accordance with the present invention, a circuit arrangement is used for post-package trimming of an analog integrated circuit, such as a five-pin linear regulator. The circuit arrangement and the analog integrated circuit may be included in a single package. The circuit arrangement includes a test mode input circuit configured to identify a test mode operation and to generate a test mode signal. A register control circuit is coupled to the test mode input circuit and configured to generate a data signal and a plurality of control signals during the test mode operation. A register circuit includes at least one bit circuit including a storage device and a shift register bit latch. The register circuit is coupled to the register control circuit to receive the data signal and the control signals. The register circuit is configured to supply the data signal and the control signals to the at least one bit circuit to program the storage device and to generate a plurality of trim control signals. A program voltage sense circuit is coupled to the register circuit and configured to sense a program voltage. A trim control circuit is coupled to the register circuit and configured to apply the trim control signals.

In an exemplary method of trimming an analog integrated circuit (e.g., a five-pin linear regulator) after packaging, a packaged integrated circuit is provided, and a test mode operation of the packaged integrated circuit is established. A plurality of input data is received during the test mode operation. A plurality of storage devices is programmed, based on the input data. A plurality of trim control signals is generated, based on the states of the storage devices. The trim control signals are applied to modify a normal operation of the packaged integrated circuit.

This post-package trimming technique has several advantages. First, by skipping the wafer sort step, the time and cost of wafer sorting are saved. Second, package shift of the parameters of trimmed die is avoided since the die are trimmed after they are packaged. Third, product delivery to customers is faster since packages need only be marked and tested upon receipt of an order, rather than trimmed, sorted, packaged, marked, and tested, all of which add up to a time consuming process. The post-package trimming technique offers customers faster delivery of a more reliable product.

BRIEF DESCRIPTION OF THE DRAWINGS

This invention will be better understood by reference to the following description and drawings. In the drawings, like or similar features are typically labeled with the same reference numbers.

DETAILED DESCRIPTION

Figure 1A:
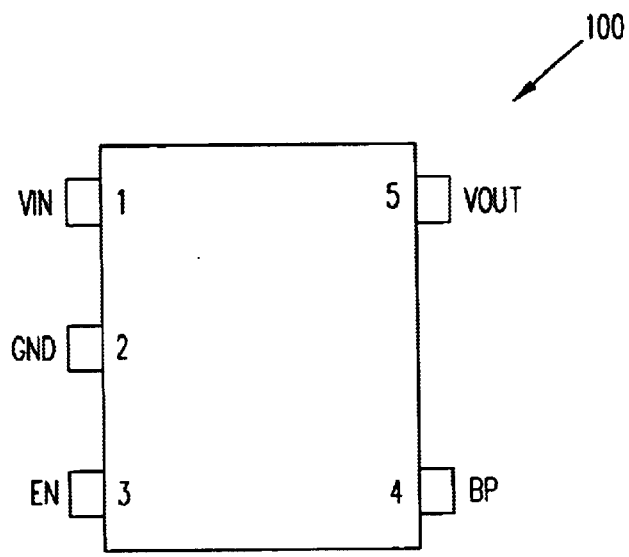
FIG. 1A is a schematic illustration of the package pin assignment of a linear regulator in accordance with the present invention.

FIG. 1A is a schematic illustration of the package pin assignment of a linear regulator 100 in accordance with the present invention. Linear regulator 100 includes five pins. In normal operation, pin 1, a VIN pin, receives an input voltage. Pin 2, a GND pin, receives a ground voltage reference. Pin 3, an EN pin, receives an enable signal. Pin 4, a BP pin, is a bypass pin. Pin 5, a VOUT pin, provides an output voltage.

In normal operation, linear regulator 100 receives an unregulated input voltage at the VIN pin and provides a constant output voltage at the VOUT pin if the voltage at the VIN pin is greater than a setpoint, which may be equal to the desired output voltage. The voltage on the EN pin is lower than the voltage on the VIN pin. A capacitor is coupled to the BP pin to function as a noise filter for linear regulator 100.

Figure 1B:
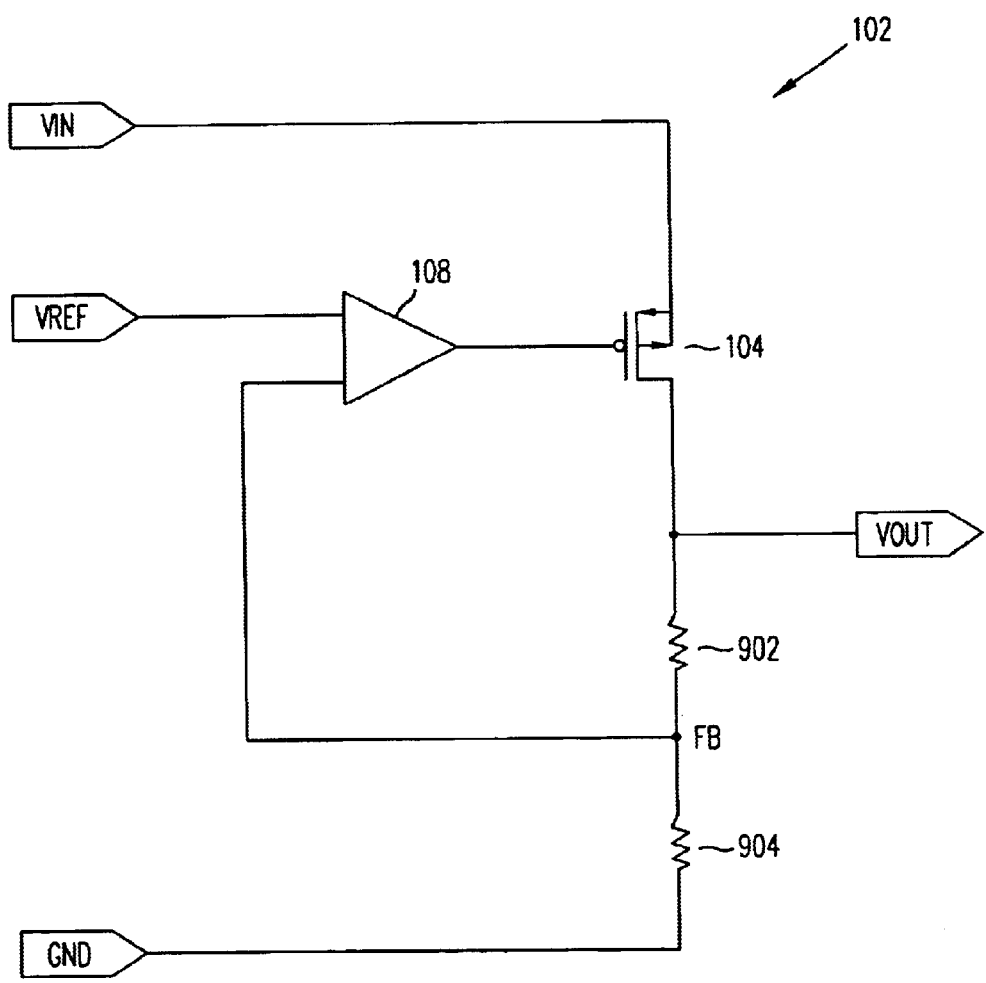
FIG. 1B is a diagram of a linear regulator circuit.

FIG. 1B is a diagram of a linear regulator circuit 102. The VIN pin, which carries the unregulated input voltage, is coupled to the source and body of a p-type MOSFET 104. The VOUT pin, which carries the regulated output voltage, is coupled to the drain of MOSFET 104. An upper resistance 902 is coupled between the drain of MOSFET 104 and a node FB. A lower resistance 904 is coupled between node FB and the GND pin. An internal reference voltage VREF is applied to a first input of an amplifier 108, and node FB is coupled to a second input of amplifier 108. The output of amplifier 108 is coupled to the gate of MOSFET 104. The drive on the gate of MOSFET 104 is adjusted by amplifier 108 to regulate the output voltage on the VOUT pin.

When the unregulated voltage on the VIN pin is equal to or less than the setpoint, then the voltage on the VOUT pin is equal to $VIN - I_{load} \times R_{dropout}$, where $R_{dropout}$ is the resistance of MOSFET 104 and $I_{load}$ is the load current drawn from the VOUT pin. When the unregulated voltage on the VIN pin is greater than the setpoint, then the voltage on the VOUT pin is a constant, as regulated by amplifier 108 and MOSFET 104.

The setpoint and regulated output voltages are constants that may be chosen by the customer from a set of options provided by the manufacturer. For example, the customer may choose VOUT=2.5V for VIN>3V. The setpoint and regulated output voltages are set by trimming resistors, such as upper and lower resistances 902 and 904, internal to linear regulator 100.

In order to trim linear regulator 100 after packaging, a test mode condition is established. In test mode, the pin functions are redefined and used to enter trim data into an internal input shift register of linear regulator 100. The data is burned, under application of a programming voltage, into a permanent storage device, such as an EPROM, an EEPROM, or a zener diode. Both the EPROM and EEPROM require a low programming current (e.g., about 100 μA). The zener diode requires a higher programming current (e.g., about 100 mA). The zener diode, however, requires no extra processing steps and can be fabricated using the same process used to fabricate linear regulator 100.

Figure 12:
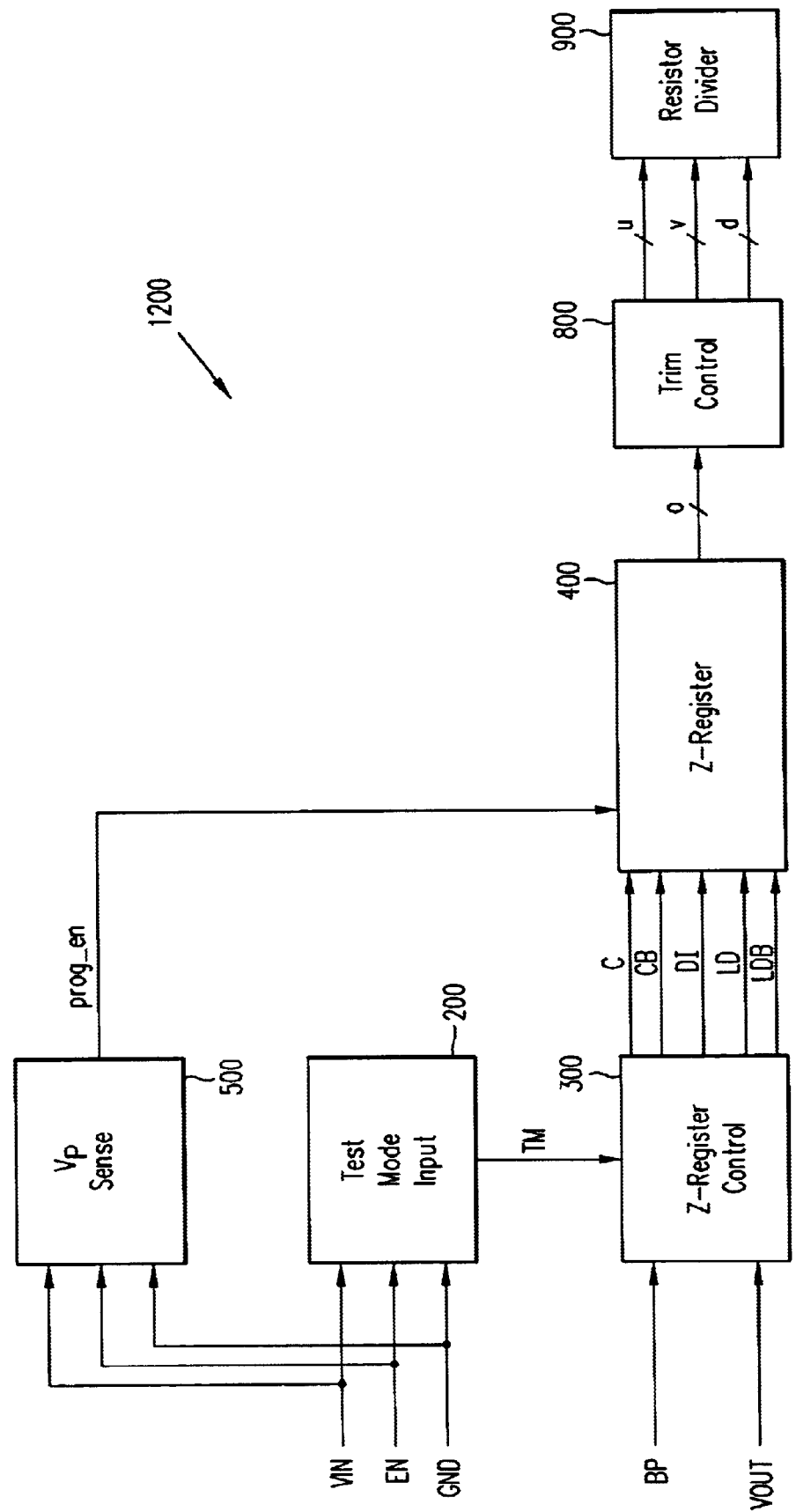
FIG. 12 is a block diagram of a circuit to trim an analog integrated circuit after packaging in accordance with the present invention.

FIG. 12 is a block diagram of a circuit 1200 to trim an analog integrated circuit (IC), such as linear regulator circuit 102 of FIG. 1B, after packaging in accordance with the present invention. Circuit 1200 and the analog IC may be included in a single package. That is, both circuit 1200 of FIG. 12 and linear regulator circuit 102 of FIG. 1B may be included in the package of linear regulator 100 of FIG. 1A. In circuit 1200, a test mode input circuit 200 receives the signals from the VIN pin, the EN pin, and the GND pin and determines whether test mode (TM) operation has been established. A TM signal is passed to a control circuit 300 along with the signals from the BP pin and the VOUT pin. Control circuit 300 generates the necessary control signals, including clock signals C and CB, data in signal DI, and load signals LD and LDB, for a register circuit 400, which includes the permanent storage elements (e.g., zener diodes) to be programmed with the trimming data, which is received on the VOUT pin.

A program voltage sense circuit 500 receives the signals from the VIN pin, the EN pin, and the GND pin and determines whether the signal on the VIN pin has reached a programming voltage. A program enable signal (prog en) is passed, along with the control signals, to register circuit 400 to indicate when programming should occur. Once the storage elements are programmed, a plurality of output signals (o in this embodiment) is passed to a trim control circuit 800. Trim control circuit 800 can generate a variety of trimming signals, which may be passed, for example, to a resistor divider circuit 900. A plurality of up adjustment signals (u in this embodiment) and a plurality of down adjustment signals (d in this embodiment) can be used to cancel process variation among wafers by adjusting built-in resistances. A plurality of output voltage selection signals (v in this embodiment) may be used to select one from a plurality of built-in voltage options.

In accordance with the present invention, the EN pin serves as the test mode control. To enter test mode, the voltage at the EN pin must be raised higher than the input voltage at the VIN pin by a given amount, for example, one threshold voltage of a MOSFET, which may be about |1.5 V|. This simulates and engages the over-temperature function, in which the VOUT pin is tri-stated, thereby decoupling the output (the VOUT pin) from the input (the VIN pin). In normal operation, test mode operation is precluded since the voltage on the EN pin is kept lower than the voltage on the VIN pin.

Figure 2:
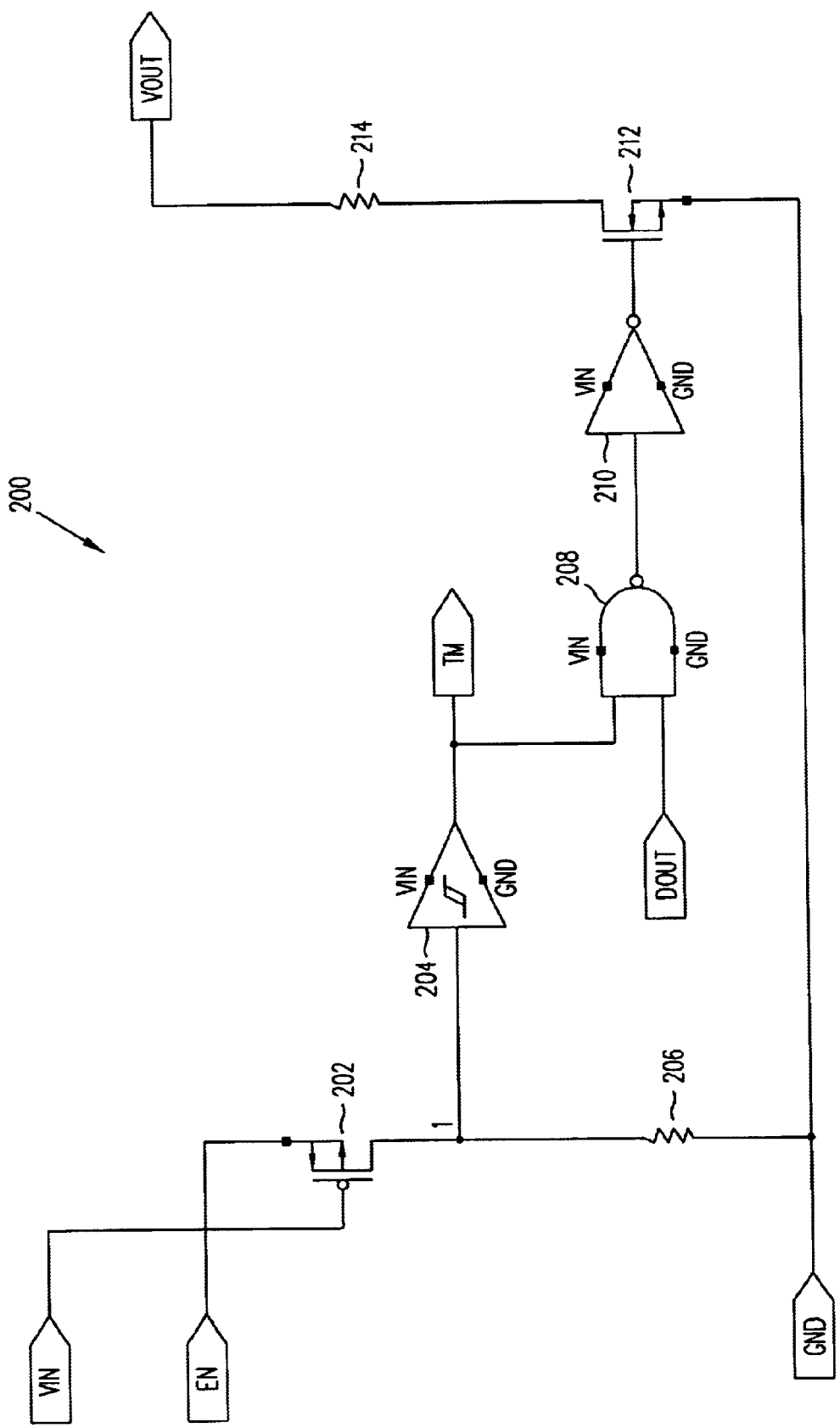
FIG. 2 is a diagram of a test mode input circuit in accordance with the present invention.

FIG. 2 is a diagram of test mode input circuit 200 in accordance with the present invention. Circuit 200 illustrates the circuitry for enabling test mode operation. A p-type MOSFET 202 includes a gate coupled to the VIN pin, a source and body coupled to the EN pin, and a drain coupled to the input of a Schmidt trigger 204. The input node of Schmidt trigger 204 is labeled "1." A resistor 206 (e.g., 100 kΩ) is coupled between the input (node 1) of Schmidt trigger 204 and the GND pin. The VIN and GND pins are also supplied to Schmidt trigger 204 as the power and ground reference voltages.

The threshold voltage of p-type MOSFET 202 and the current load of resistor 206 define the voltage for test mode operation. P-type MOSFET 202 turns on when the gate-to-source voltage falls below one threshold voltage. This occurs when the voltage on the EN pin (MOSFET 202 source voltage) is greater than the voltage on the VIN pin (MOSFET 202 gate voltage) by the magnitude of one threshold voltage of MOSFET 202. Once MOSFET 202 turns on, the current through resistor 206 increases, and the voltage at node 1, the input to Schmidt trigger 204, begins to increase. When the voltage at node 1 increases past the threshold of Schmidt trigger 204, the output of Schmidt trigger 204 (labeled TM) is pulled to logic high. The TM signal is maintained at logic high as long as the input voltage to Schmidt trigger 204 is above the threshold of Schmidt trigger 204. The TM signal, which indicates test mode with a high logic level, is then passed to other circuits.

Figure 13:
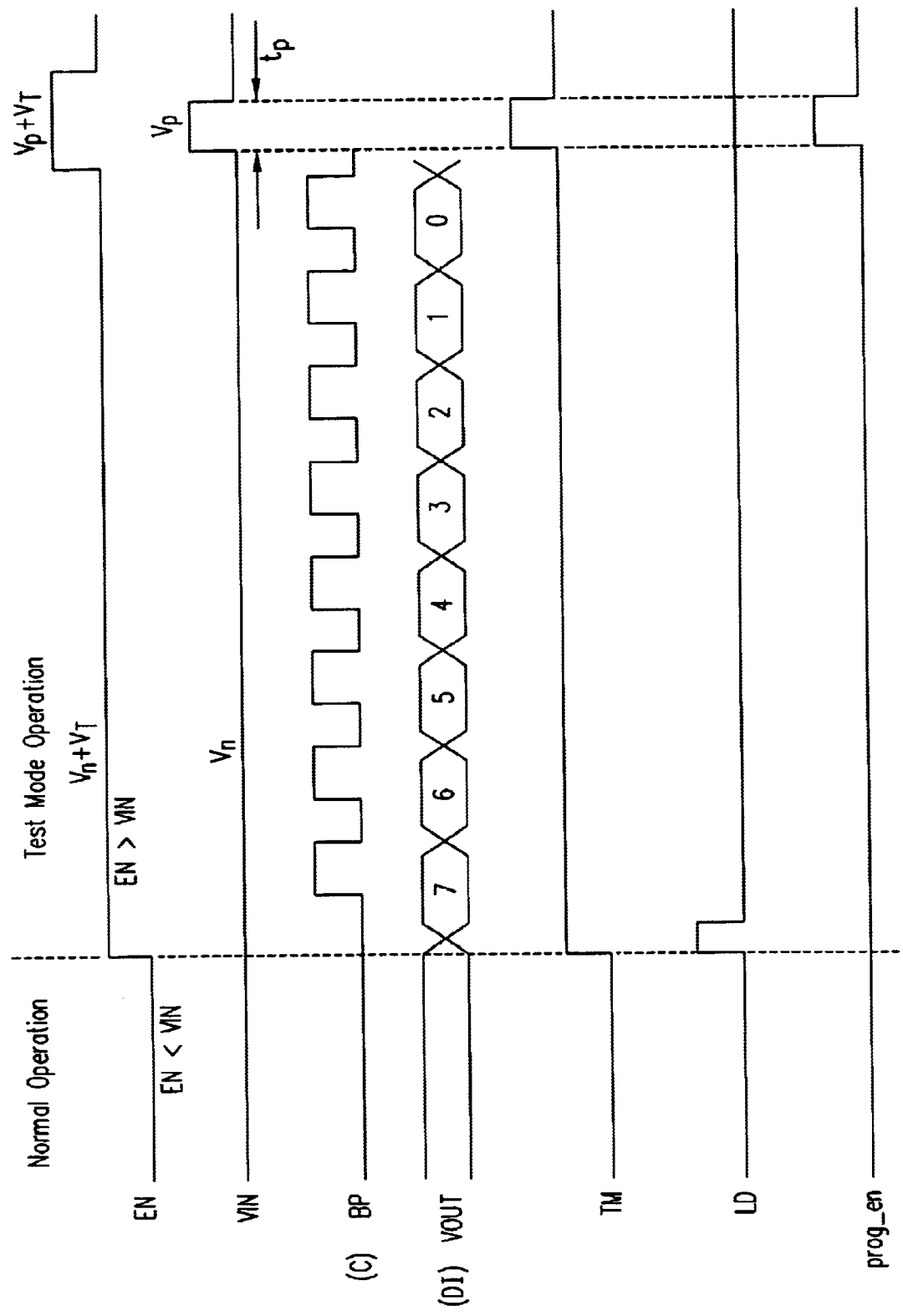
FIG. 13 is a timing diagram for the circuit of FIG. 12.

FIG. 13 is a timing diagram for circuit 1200 of FIG. 12. The diagram shows the signal on the EN pin is lower than the signal on the VIN pin during normal operation. During test mode operation, the signal on the EN pin is raised above the signal on the VIN pin, causing the TM signal to raise to logic high.

A method for reading the states of the storage devices (e.g., zener diodes) can be provided as an additional feature of the post-packaging trimming technique of the present invention. An internal output shift register can be loaded with the state bits when test mode is entered. A resistive pull down network on the VOUT pin can be switched on when the state bit is a "1" during a cycle of the shift clock to read the data from the output shift register. Since the state data is loaded upon entering test mode, an initial test mode operation loads the states of the unprogrammed storage devices, prior to subsequent programming. In order to read the states of the programmed storage devices, a second test mode operation is performed, during which no programming of any storage devices occurs. The data provided by this feature may be useful for failure analysis of the trimming technique.

The circuitry to switch on the resistive network for reading storage device state data at the VOUT pin during test mode is also shown in FIG. 2. The output of Schmidt trigger 204 is coupled to the first input of a NAND gate 208. The output (labeled Dout) of an internal output shift register (not shown) is coupled to the second input of NAND gate 208. An inverter 210 is coupled between the output of NAND gate 208 and the gate of an n-type MOSFET 212. The source and body of MOSFET 212 are coupled to the GND pin. A resistor 214 is coupled between the drain of MOSFET 212 and the VOUT pin. The VIN and GND pins are also supplied to NAND gate 208 and inverter 210 as the power and ground reference voltages.

The storage device state data from the output shift register is read out by sensing current. When the TM signal (the output of Schmidt trigger 204) applied to the first input of NAND gate 208 is logic high (i.e., indicating test mode operation), the output of NAND gate 208 is the opposite of Dout. The output of inverter 210 is Dout, which is applied to the gate of MOSFET 212. The current through resistor 214, which may have a value of about 2 kΩ, is sensed to read Dout. When Dout is logic high, MOSFET 212 is on and a non-zero current (e.g., 100 μA to 100 mA) is sensed at the VOUT pin. When Dout is logic low, MOSFET 212 is off and a zero current is sensed at the VOUT pin. During each cycle of the shift clock, a subsequent Dout value is provided from the output shift register to NAND gate 208.

Returning to the programming discussion, once in test mode, the VOUT and VIN pins are decoupled. The BP pin becomes a clock pin for the input shift register, and the VOUT pin becomes a data in pin for the internal input shift register. With these new definitions, the register is serially loaded one bit at a time.

Figure 3:
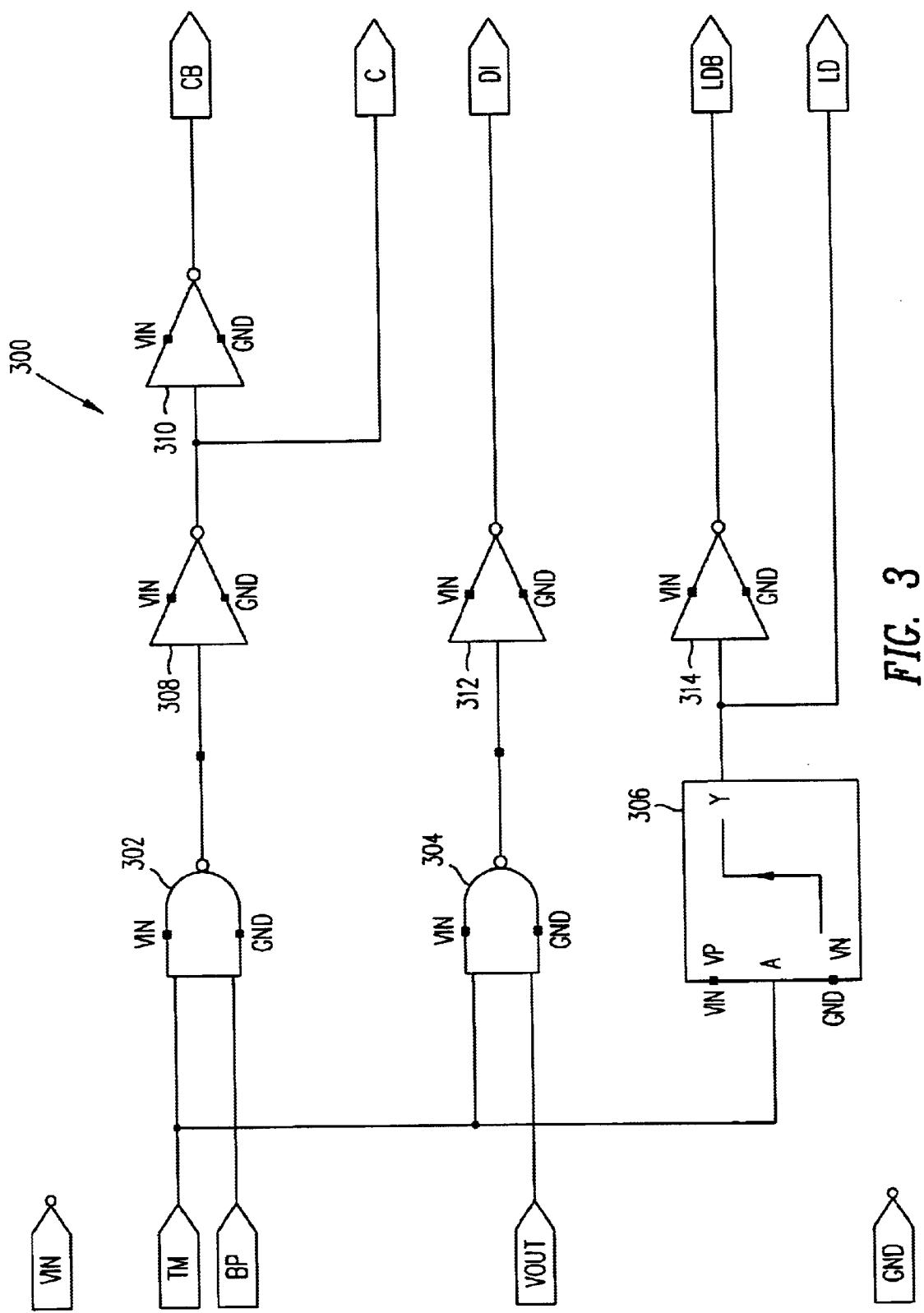
FIG. 3 is a diagram of a control circuit for the register circuit of FIG. 4 in accordance with the present invention.

FIG. 3 is a diagram of control circuit 300 for register circuit 400 of FIG. 4 (discussed below) in accordance with the present invention. Circuit 300 generates the clock, data, and load control signals for register circuit 400. In FIG. 3, the output of Schmidt trigger 204 of FIG. 2 is coupled to the first input of a NAND gate 302, the first input of a NAND gate 304, and to the input of a rising edge detector 306. This applies the TM signal to the aforementioned inputs.

A clock signal is applied at the BP pin, which is coupled to the second input of NAND gate 302. The output of NAND gate 302 is coupled to the input of an inverter 308. The output of inverter 308 is coupled to the input of an inverter 310. When the TM signal is logic high, indicating test mode operation, the output of NAND gate 302 is the opposite of the clock signal, i.e., the inverted clock signal. The inverted clock signal is inverted by inverter 308 to reform the clock signal (C), which is tapped at the output of inverter 308. The clock signal (C) is inverted once again by inverter 310 to form the inverted clock signal, also called clock bar (CB).

A data in signal for programming the zener diodes is applied at the VOUT pin, which is coupled to the second input of NAND gate 304. The output of NAND gate 304 is coupled to the input of an inverter 312. When the TM signal is logic high, indicating test mode operation, the output of NAND gate 304 is the inverted data in signal. The inverted data in signal is inverted by inverter 213 to reform the data in signal (DI). The data in signal (a voltage signal) can be loaded from the VOUT pin at the same time that the programmed data bits are read from the output shift register (by sensing current, not voltage) as discussed above.

Rising edge detector 306 generates and outputs, for example, a 200 ns pulse on the rising edge of the TM signal (i.e., upon entering test mode). This is the load signal (LD) for the output shift register. An inverter 314 coupled to the output of rising edge detector 306 inverts the load signal LD, to generate an inverted load signal, also called load bar (LDB), for the output shift register.

The VIN and GND pins are also shown in FIG. 3, since they are supplied as the power and ground references to rising edge detector 306, to NAND gates 302 and 304, and to inverters 308, 310, 312, and 314.

The signal on the BP pin, which forms the clock signal C during test mode, is shown in the timing diagram of FIG. 13. The clock signal C may cycle at a frequency from the mHz range to the MHz range. The signal on the VOUT pin, which forms the data in signal DI during test mode, is also shown. The DI signal is shown with a plurality (eight in this embodiment) of values (7 through 0) that are stable during the rising edge of the clock signal C for use by register circuit 400 of FIG. 4, discussed below. The 200 ns load signal LD pulse for the output shift register is also shown in FIG. 13, coinciding with the rising edge (from logic low to logic high) of the TM signal.

Figure 4B:
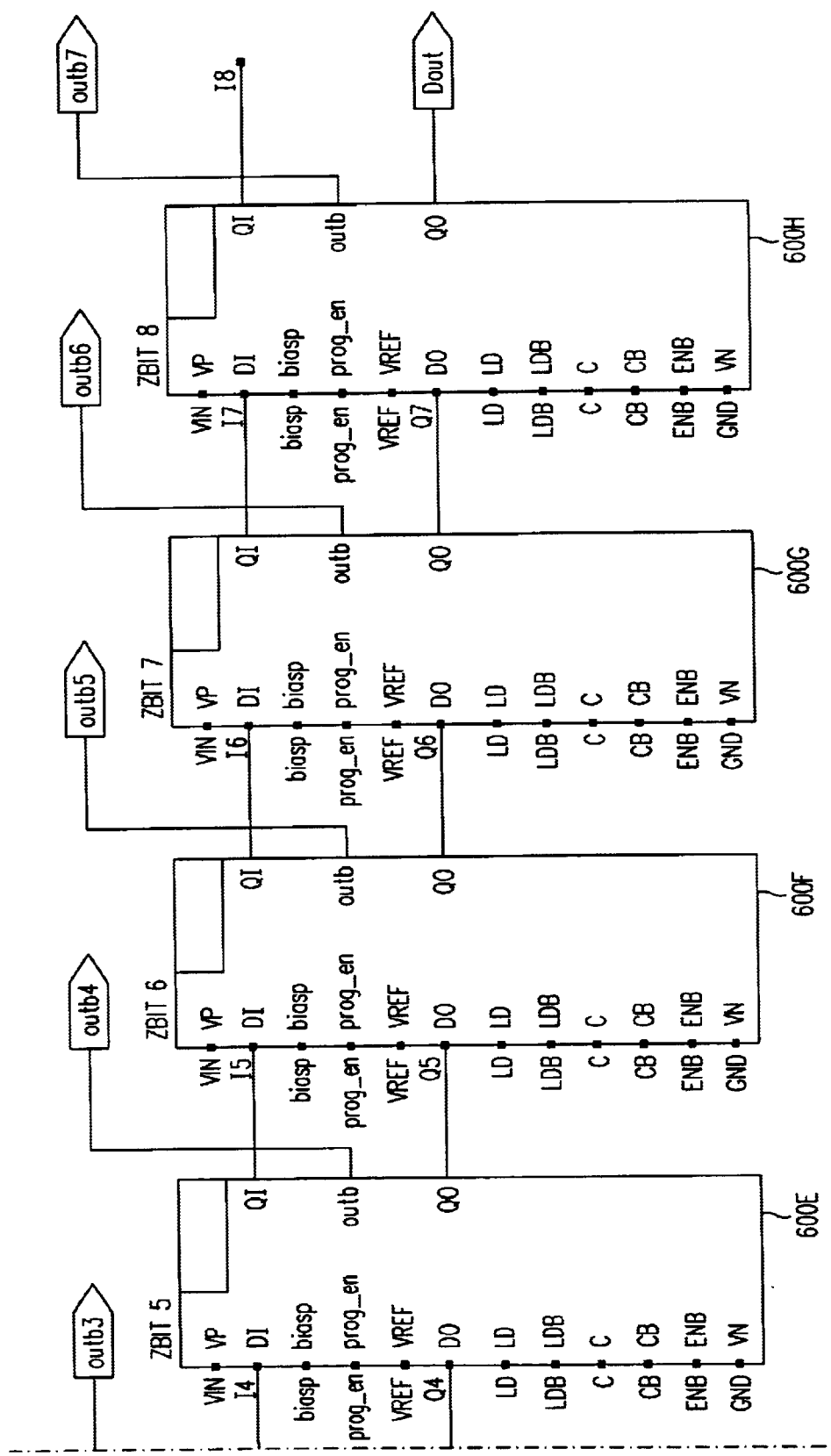
FIG. 4 is a diagram of a register circuit including a plurality of serialized zener bit circuits of FIG. 6 in accordance with the present invention.

In accordance with the present invention, the signals (CB, C, DI, LDB, and LD) generated by control circuit 300 of FIG. 3 are applied to register circuit 400 of FIG. 4. FIG. 4 is a diagram of register circuit 400 including a plurality (e.g., eight in this embodiment) of serialized zener bit circuits 600A through 600H (see FIG. 6 discussed in more detail below). The signals C, CB, LD, and LDB, are applied to each of zener bit circuits 600A through 600H.

Each zener bit circuit 600A through 600H has an input labeled DI and an output labeled QI, which are the input and output, respectively, of the input shift register bit for the respective zener bit circuit. The data in signal (DI) from control circuit 300 is coupled only to the DI input of the first zener bit circuit 600A. The DI input of each zener bit circuit 600B through 600H is coupled to the QI output of the preceding zener bit circuit 600A through 600G, respectively, thereby forming the entire input shift register for incoming program data. The data in signal DI is passed to each successive zener bit circuit 600A through 600H with each pulse of clock signal C (see FIG. 13).

Each zener bit circuit 600A through 600H in FIG. 4 has an input labeled DO and an output labeled QO, which are the input and output, respectively, of the output shift register bit for the respective zener bit circuit. The DO input of zener bit circuit 600A is coupled to the GND pin. The DO input of each zener bit circuit 600B through 600H is coupled to the QO output of the preceding zener bit circuit 600A through 600G, respectively, thereby forming the entire output shift register for reading the programmed data.

Each of zener bit circuits 600A through 600H also receives a power reference (from the VIN pin), a ground reference (from the GND pin), an inverted enable signal (also called enable bar, ENB), a biasing signal (biasp), a voltage reference (VREF), and the program enable signal (prog en). The biasing signal (biasp) and voltage reference (VREF) are used in programming a zener diode (not shown) in each zener bit circuit 600A through 600H, as discussed in more detail with reference to FIG. 7 below. The program enable signal, prog en, signifies whether the proper programming voltage has been achieved on the VIN pin, in preparation for programming the zener diodes once all the programming data has been loaded into the input shift register.

Figure 5:
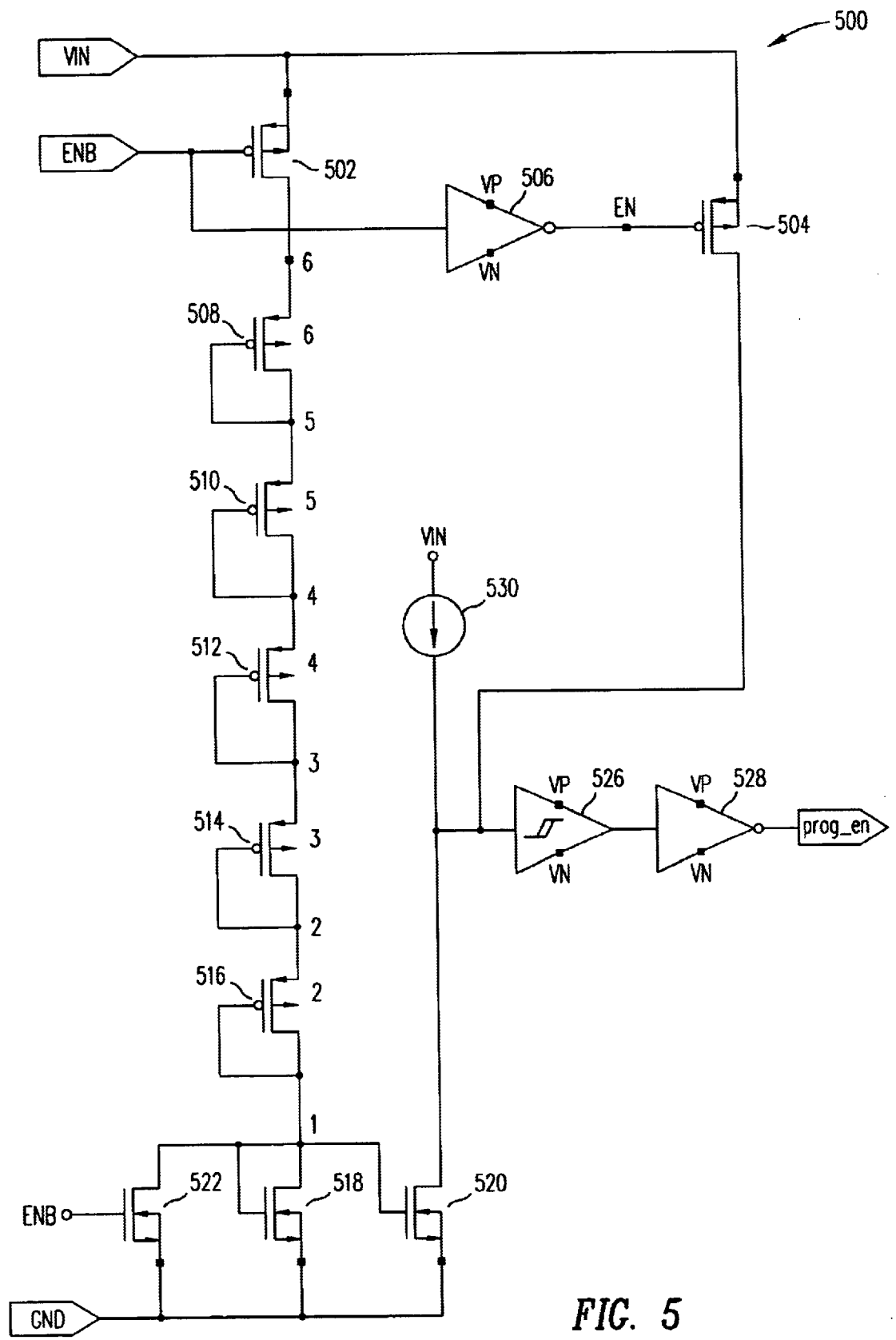
FIG. 5 is a diagram of a program voltage sense circuit in accordance with the present invention.

The program enable signal, prog en, is generated in accordance with the present invention by program voltage sense circuit 500 shown schematically in FIG. 5. A p-type MOSFET 502 and a p-type MOSFET 504 serve as on/off switches in sense circuit 500. The VIN pin is coupled to the bodies and sources of MOSFETs 502 and 504. The enable bar signal (ENB) is coupled to the gate of MOSFET 502. An inverter 506 is coupled between the gate of MOSFET 502 and the gate of MOSFET 504, so that the enable signal (EN) is applied to the gate of MOSFET 504.

A plurality (e.g., five in this embodiment) of serially-coupled, diode-connected p-type MOSFETs 508, 510, 512, 514, and 516 establish a rudimentary reference voltage level in sense circuit 500. The drain of MOSFET 502 is coupled to the source of MOSFET 508, which is the first p-type MOSFET in the serially-coupled plurality. For MOSFETs 508, 510, 512, and 514, the drain and gate of each MOSFET is coupled to the source of the subsequent MOSFET. The bodies of MOSFETs 508, 510, 512, 514, and 516 are coupled to their respective sources.

An n-type MOSFET 518 and an n-type MOSFET 520 function as a current mirror in sense circuit 500. The drain and gate of MOSFET 516, the last in the serially-coupled plurality of diode-connected p-type MOSFETs, are coupled to the drain and gate of MOSFET 518, which is also diode-connected. The sources and bodies of MOSFETs 518 and 520 are coupled to the GND pin. The gates of MOSFETs 518 and 520 are coupled together.

An n-type MOSFET 522 also functions as an on/off switch in sense circuit 500. The source and body of MOSFET 522 are coupled to the GND pin. The gate of MOSFET 522 is coupled to the enable bar signal (ENB). The drain of MOSFET 522 is coupled to the gate and drain of MOSFET 518.

The program enable signal, prog en, is maintained by a Schmidt trigger 526. The drains of p-type MOSFET 504 and n-type MOSFET 520 are coupled to the input of Schmidt trigger 526. The output of Schmidt trigger 526 is coupled to the input of an inverter 528, whose output is the program enable signal, prog en. A current source (e.g., 1 $\mu$A) is coupled between the VIN pin and the input of Schmidt trigger 526.

During normal operation, the voltage on the EN pin is low, and the enable bar signal (ENB) is high. P-type MOSFET 502, which has the high ENB signal applied at its gate, is turned off, isolating the reference voltage stack of diode-connected p-type MOSFETs 508, 510, 512, 514, and 516. N-type MOSFET 522, which has the high ENB signal applied at its gate, is turned on, pulling the voltage on the gate of MOSFET 520 low and turning MOSFET 520 off. This allows MOSFET 504, which is turned on with a low enable signal EN on its gate, to pull the voltage at the input of Schmidt trigger 526 up. Once the voltage at the input of Schmidt trigger 526 increases past the threshold of Schmidt trigger 526, the output of Schmidt trigger 526 goes high, and the program enable signal, prog en, is driven low by inverter 528.

During test mode operation, the voltage on the EN pin is high, and the enable bar signal (ENB) is low. P-type MOSFET 502, which has the low ENB signal applied at its gate, is turned on, allowing current to flow through the reference voltage stack of diode-connected p-type MOSFETs 508, 510, 512, 514, and 516. N-type MOSFET 522, which has the low ENB signal applied at its gate, is turned off, allowing the voltage on the gate of MOSFET 520 to rise and turn MOSFET 520 on. P-type MOSFET 504, which has the high enable signal EN applied at its gate, is turned off, allowing MOSFET 520 to control the voltage at the input of Schmidt trigger 526.

The current flowing through n-type MOSFET 520 is mirrored from the current flowing through p-type MOSFET 502, the reference voltage stack of diode-connected p-type MOSFETs (508, 510, 512, 514, and 516), and n-type MOSFET 518. The two currents will differ, depending on the relative sizes of MOSFETs 518 and 520. For example, if the current flowing through MOSFET 518 is I, then the current flowing through MOSFET 520 will be 4/7 I, for a size ratio of 4/7. The current flowing through MOSFET 520 is supplied by current source 530.

The number of diode connected p-type MOSFETs in the reference voltage stack is chosen to allow conduction of a certain current (e.g., 1 $\mu$A) when the voltage on the VIN pin transitions from a normal operating voltage level ($V_n$) to a program voltage level ($V_p$). This current level is higher than the current level that usually flows through the reference voltage stack. When the current flowing through the reference voltage stack increases, the mirrored current flowing through MOSFET 520 also increases. This pulls down the drain voltage of MOSFET 520, and therefore the input voltage of Schmidt trigger 526.

The higher current flow associated with the program voltage level $V_p$ on the VIN pin allows the voltage at the input of Schmidt trigger 526 to decrease past the threshold of Schmidt trigger 526. The output of Schmidt trigger 526 transitions low, and the program enable signal, prog en, is driven high by inverter 528. The program enable signal, prog en, which is at logic high when the program voltage level $V_p$ is sensed on the VIN pin, is shown in the timing diagram of FIG. 13. The duration ($t_p$) of the program voltage $V_p$ pulse may be about 1–2 $\mu$s. The program pulse duration is short and the program voltage level $V_p$ is high, so that programming of the zener diodes occurs quickly and also to guarantee that the programming condition does not arise in normal operation, where VIN is usually less than 5.5 V.

As discussed previously, in test mode operation, the voltage at the EN pin must be higher than the voltage at the VIN pin by about one MOSFET threshold voltage to tri-state the VOUT pin. As shown in FIG. 13, in order to maintain test mode operation during the program pulse, the voltage at the EN pin must, therefore, be raised while the program voltage $V_p$ is present at the VIN pin. In addition, since the voltage at the VIN pin establishes the analog value of the logic high state, the voltage of the TM signal also raises. This increase, however, does not change the logic high state of the TM signal.

Figure 6:
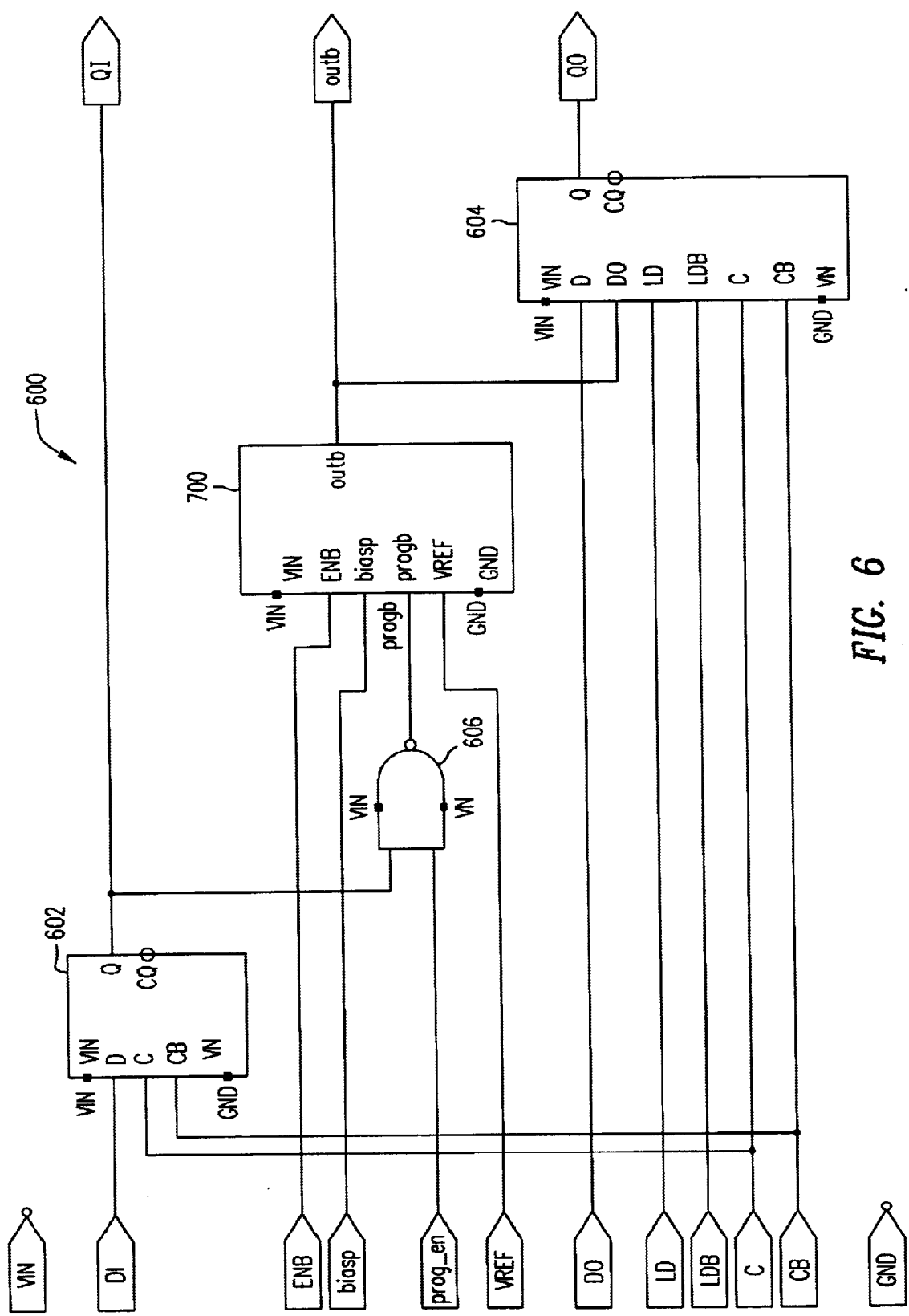
FIG. 6 is a diagram of a zener bit circuit, including a zener diode circuit of FIG. 7, in accordance with the present invention.

The program enable signal, prog en, is passed to each zener bit circuit 600A through 600H of FIG. 4 to enable programming of respective zener diodes, based on the contents of the loaded input shift register. FIG. 6 is a diagram of a zener bit circuit 600, including a zener diode circuit 700 of FIG. 7 (discussed in more detail below), in accordance with the present invention. Zener bit circuit 600 includes an input shift register bit latch 602 and an output shift register bit latch 604. The data inputs, DI and DO, respectively, of input and output shift register bit latches 602 and 604 are coupled to the data outputs (QI and QO, respectively), of the corresponding bit latches 602 and 604 in the preceding zener bit circuit 600. Similarly, the data outputs, QI and QO, respectively, of input and output shift register bit latches 602 and 604 are coupled to the data inputs (DI and DO, respectively), of the corresponding bit latches 602 and 604 in the following zener bit circuit 600 (see FIG. 4).

A plurality of input shift register bit latches 602 (e.g., one for each zener bit circuit 600A through 600H in FIG. 4) thus acts as the internal input shift register. Similarly, a plurality of output shift register bit latches 604 (e.g., one for each zener bit circuit 600A through 600H in FIG. 4) acts as the internal output shift register. As discussed previously, the first zener bit circuit 600 in the serially-coupled plurality receives its DI signal from the VOUT pin, and the DO input is coupled to the GND pin. The last zener bit circuit 600 in the serially-coupled plurality provides its QO signal to the VOUT pin (see FIG. 4).

In FIG. 6, input and output shift register bit latches 602 and 604 both receive the clock (C) and clock bar (CB) signals to synchronize sequential loading of the latches 602 and 604 in each zener bit circuit 600. The VIN and GND pins are also supplied to latches 602 and 604 as the power and ground reference voltages. Output shift register bit latch 604 additionally receives the load (L) and load bar (LB) signals to facilitate parallel loading of the state of the zener diode, coincident with the rising edge of the TM signal. Latches 602 and 604 may be conventional latches as known in the art.

The output, QI, of input shift register bit latch 602 is coupled to the first input of a NAND gate 606 (in addition to being coupled to the input, DI, of the input shift register bit latch 602 in the following zener bit circuit 600). The second input of NAND gate 606 is coupled to the output of inverter 528 of program voltage sense circuit 500 (see FIG. 5), thereby providing the program enable signal, prog en, to NAND gate 606. While the input shift register bit latches 602 are being loaded, the program enable signal, prog en, is low (see FIG. 13). The output of NAND gate 606, which is coupled to the program bar (progb) input of zener diode circuit 700, is held high. This prevents any inadvertent, premature programming of the zener diode in zener diode circuit 700.

Once the input shift register has been fully loaded, each input shift register bit latch 602 in zener bit circuits 600A through 600H of FIG. 4 has its respective programming bit. The program enable signal, prog en, transitions to a high level when the programming voltage ($V_p$) is sensed at the VIN pin by program voltage sense circuit 500 (see FIG. 5 and FIG. 13). NAND gate 606 (see FIG. 6) then delivers the inverted DI signal to the program bar, progb, input of zener diode circuit 700 for programming of its zener diode (not shown). Zener diode circuit 700 also receives a power reference (from the VIN pin), a ground reference (from the GND pin), the enable bar signal (ENB), the biasing signal (biasp), and the voltage reference (VREF).

Figure 7:
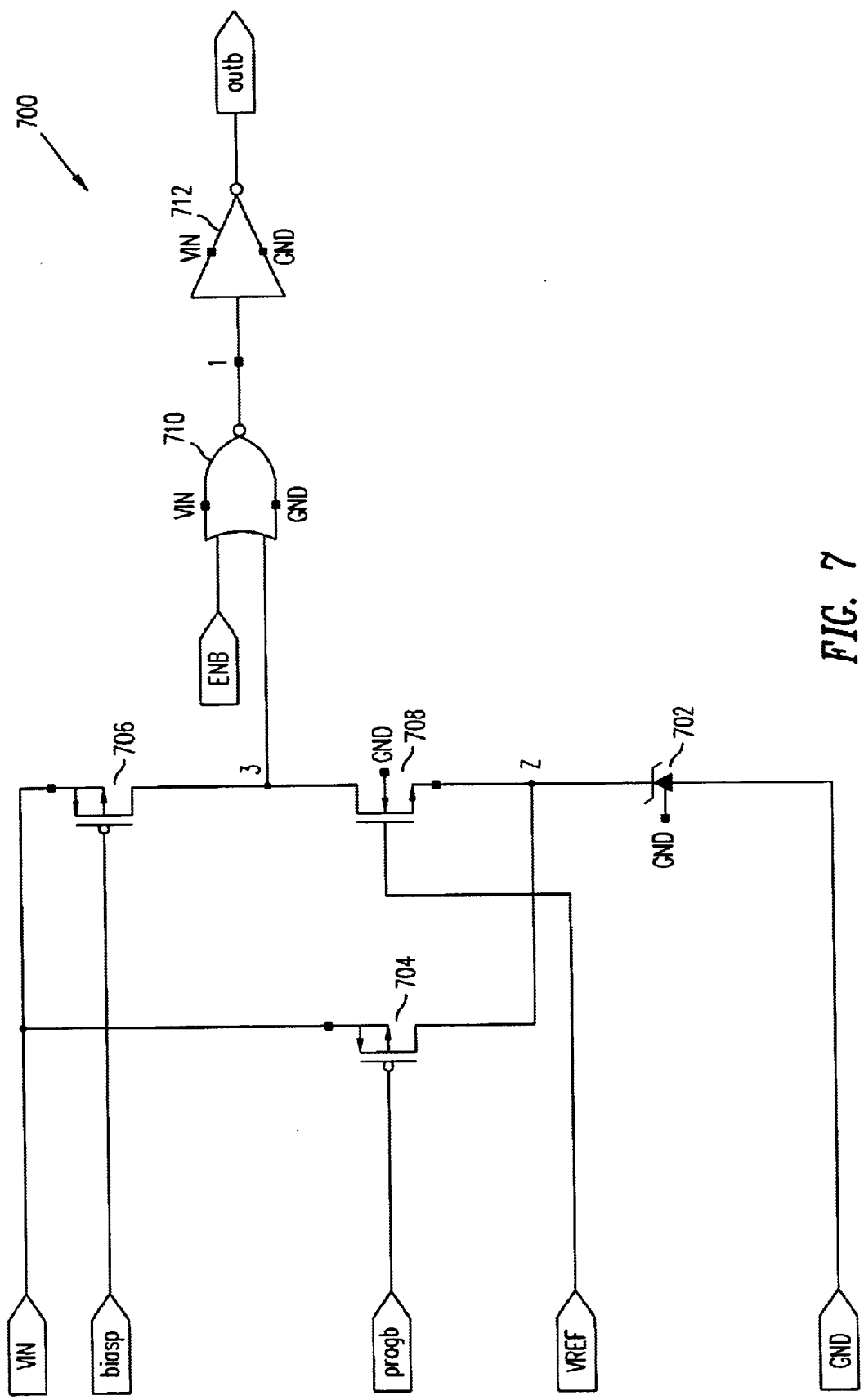
FIG. 7 is a diagram of a zener diode circuit in accordance with the present invention.

In some embodiments, the zener diodes in each of zener bit circuits 600A through 600H are programmed all at once. In still other embodiments, the zener diodes are programmed serially. FIG. 7 is a diagram of a zener diode circuit 700 in accordance with the present invention. The P$^+$ side of a zener diode 702 is coupled to the GND pin. A p-type MOSFET 704 acts as a programming switch. The source and body of MOSFET 704 are coupled to the VIN pin. The gate of MOSFET 704 receives the program bar signal (progb). The drain of MOSFET 704 is coupled to the N$^+$ side (node Z) of zener diode 702. A p-type MOSFET 706 acts as a current source. The source and body of MOSFET 706 are coupled to the VIN pin. The gate of MOSFET 706 receives the biasing signal (biasp).

An n-type MOSFET 708 acts as a voltage controller for node Z. The source of MOSFET 708 is coupled to the N$^+$ side (node Z) of zener diode 702. The body of MOSFET 708 is coupled to the GND pin. The gate of MOSFET 708 receives the voltage reference signal (VREF). The drain (node 3) of MOSFET 708 is coupled to the drain of MOSFET 706.

A current comparator includes a NOR gate 710 with a first input coupled to receive the enable bar signal (ENB), a second input coupled to node 3, and an output coupled to the input of an inverter 712. The output of inverter 712 provides the output signal (outb) of zener diode circuit 700. The VIN and GND pins are supplied to NOR gate 710 and inverter 712 as the power and ground reference voltages.

Initially upon fabrication, zener diode 702 is an open circuit. MOSFET 706 is biased, using the biasing signal (biasp) applied to the gate, to supply a nominal current (e.g., 500 nA). Part of this current flows through MOSFET 708 and zener diode 702. MOSFET 708 maintains the N$^+$ side (node Z) of zener diode 702 at about one threshold voltage below the voltage reference signal, VREF, applied to the gate of MOSFET 708. This helps account for the voltage dependency of the leakage current through zener diode 702, and helps keep each such zener diode 702 in the various zener bit circuits 600 (see FIG. 6) of register circuit 400 (see FIG. 4) operating similarly. VREF is the constant internal voltage reference in linear regular circuit 102 (see FIG. 1B) and may be approximately 1.2V. Thus, the voltage at node Z may initially be about 0.5 V. Since zener diode 702 is reverse biased in this configuration, the leakage current through zener diode 702 will be much less than the 500 nA nominal current supplied by MOSFET 706. This will allow MOSFET 706 to pull node 3 up.

To program zener diode 702, the N$^+$ side (node Z) of the PN junction must be raised to a programming level that is a higher voltage than the P$^+$ side (e.g., about 7.5 V higher). The programming voltage ($V_p$) is applied to the VIN pin. P-type MOSFET 704 acts as a switch between the VIN pin and node Z. MOSFET 704 is either conducting (on) or not conducting (off) based on the data loaded into input shift register bit latch 602 (see FIG. 6) at the time the programming voltage $V_p$ is sensed on the VIN pin (see FIG. 5). During programming, the program enable signal, prog en, is high (see FIG. 5 and FIG. 13), and the inverted DI signal is supplied to the program bar, progb, input of zener diode circuit 700 (see FIG. 6).

If the data in signal (DI) is low, zener diode 702 is not to be programmed. The inverted DI signal applied to progb (and thus to the gate of MOSFET 704) is high, and MOSFET 704 is held off. Thus, zener diode 702 remains unprogrammed (i.e., an open circuit), and node 3 is pulled up, as discussed above.

If the data in (DI) signal is high, zener diode 702 is to be programmed (i.e., short-circuited). The inverted DI signal applied to progb (and to the gate of MOSFET 704) is low, and MOSFET 704 turns on. Node Z is pulled up to the programming voltage of the VIN pin (e.g., about 7.5 V). A high programming current (e.g., 100 mA) will flow from the VIN pin through zener diode 702, turning zener diode 702 into a short circuit. The actual values of the programming voltage and programming current may vary with the process used to fabricate zener diode 702. Short-circuiting zener diode 702 pulls node Z to the potential of the GND pin, and node 3 is also pulled down through MOSFET 708.

The state of zener diode 702 is determined from the voltage of node 3. As discussed above, node 3 will be high if zener diode 702 is not programmed (i.e., an open circuit). Node 3 will be low if zener diode 702 has been programmed (i.e., a short circuit). During normal operation, the voltage on the EN pin is low, and the enable bar signal (ENB) is high. The output of NOR gate 710 will be held low, and the output (outb) of zener diode circuit 700, will be held high. During test mode operation, the voltage on the EN pin is high, and the enable bar signal (ENB) is low. The output of NOR gate 710 will be the inverted voltage state of node 3, and the output (outb) of zener diode circuit 700, will be the voltage state of node 3 (i.e., low for a programmed zener diode 702, high for an unprogrammed zener diode 702). NOR gate 710 also functions as a power down control to prevent shoot-through current through inverter 712 if node 3 is left in an intermediate state upon power down of the analog IC.

In some embodiments, zener diode 702 in zener diode circuit 700 may be replaced with an EPROM or EEPROM device. An EPROM or EEPROM storage device occupies less area on the semiconductor die than zener diode 702 because it can be programmed using less power. In the case of some linear regulators, however, the EPROM or EEPROM devices may result in higher fabrication costs because EPROM or EEPROM devices require some process steps not included in standard linear regulator processes, which can be used to fabricate zener diode 702 at no extra cost.

As shown in FIG. 6, the output (outb) of zener diode circuit 700 is coupled to an input of output shift register bit latch 604. As shown in FIG. 4, the output shift register bit latches 604 combine to form an output shift register with an output Dout. As shown in FIG. 2, Dout can be passed to the VOUT pin for failure analysis of the trimming mechanism.

As shown in FIG. 4, each zener bit circuit 600A through 600H produces an output signal (outb0 through outb7, respectively). These output signals can be used in the trimming process to select an output voltage from among several built-in options or to cancel process variation among devices by adjusting voltages within set tolerances. In this embodiment, the eight output signals represent 256 possible states. The signals are decoded and used, for example, to short or un-short resistors to adjust voltages as desired.

Figure 8:
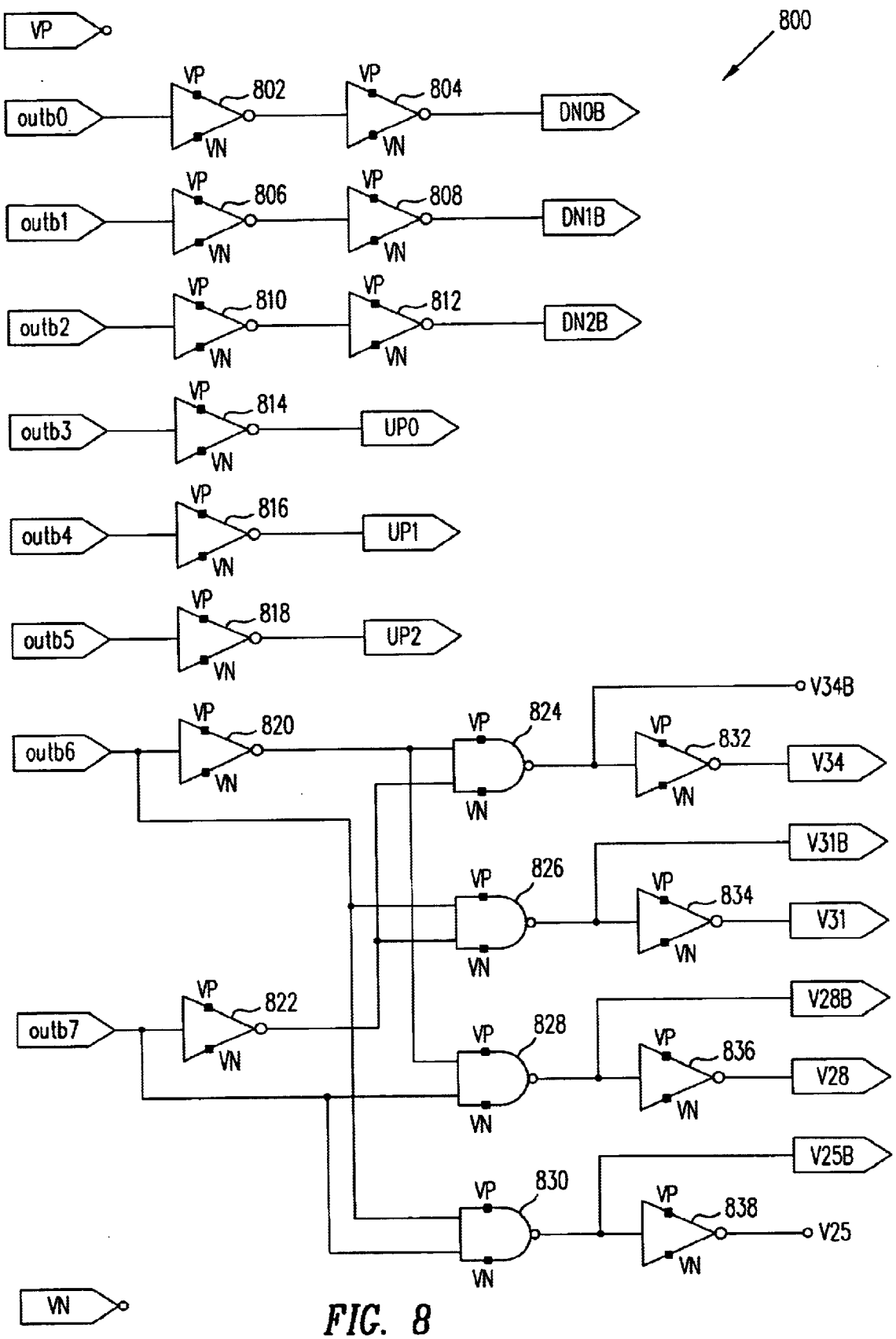
FIG. 8 is a diagram of a trim control circuit in accordance with the present invention.

FIG. 8 is a diagram of trim control circuit 800 in accordance with the present invention. In trim control circuit 800, output signals outb0, outb1, and outb2 (from zener bit circuits 600A, 600B, and 600C of FIG. 4) are respectively coupled to serially-coupled pairs of inverters 802/804, 806/808, and 810/812 to generate down adjustment signals DN0B, DN1B, and DN2B. The down adjustment signals DN0B, DN1B, and DN2B will mirror the states of output signals outb0, outb1, and outb2. The down adjustment signals DN0B, DN1B, and DN2B may represent a total downward shift of, for example, −200 mV.

Output signals outb3, outb4, and outb5 (from zener bit circuits 600D, 600E, and 600F of FIG. 4) are respectively coupled to inverters 814, 816, and 818 to generate up adjustment signals UP0, UP1, and UP2. The up adjustment signals UP0, UP1, and UP2 will be inverted from the states of output signals outb3, outb4, and outb5. The up adjustment signals UP0, UP1, and UP2 may represent a total upward shift of, for example, +200 mV.

Output signals outb6 and outb7 (from zener bit circuits 600G and 600H of FIG. 4) are respectively coupled to inverters 820 and 822. The non-inverted and inverted output signals are coupled to a logic network including a plurality of two-input NAND gates (four in this embodiment) and a plurality of inverters (four in this embodiment) to choose one output voltage for linear regulator circuit 102 (see FIG. 1B). A NAND gate 824 is coupled to receive the inverted outb6 signal and the inverted outb7 signal. A NAND gate 826 is coupled to receive the non-inverted outb6 signal and the inverted outb7 signal. A NAND gate 828 is coupled to receive the inverted outb6 signal and the non-inverted outb7 signal. A NAND gate 830 is coupled to receive the non-inverted outb6 signal and the non-inverted outb7 signal.

The outputs of NAND gates 824, 826, 828, and 830 are respectively coupled to the inputs of inverters 832, 834, 836, and 838. The inputs of inverters 832, 834, 836, and 838 are tapped to supply signals V34B, V31B, V28B, and V25B. The outputs of inverters 832, 834, 836, and 838 are tapped to supply signals V34, V31, V28, and V25. In this embodiment, signal pairs V34B/V34, V31B/V31, V28B/V28, and V25B/V25 correspond to output voltages of 3.4V, 3.1V, 2.8V, and 2.5V, respectively. The logic defined by NAND gates 824, 826, 828, and 830 and inverters 832, 834, 836, and 838 ensures that for all combinations of output signals outb6 and outb7, a unique output voltage will be selected. If, for example, the 2.5V output voltage is selected, the signal pair V25B/V25 will have values of 0/1, while all other pairs will have values of 1/0.

Positive and negative reference voltages (VP and VN) are also provided to the NAND gates and inverters of trim control circuit 800.

Figure 9:
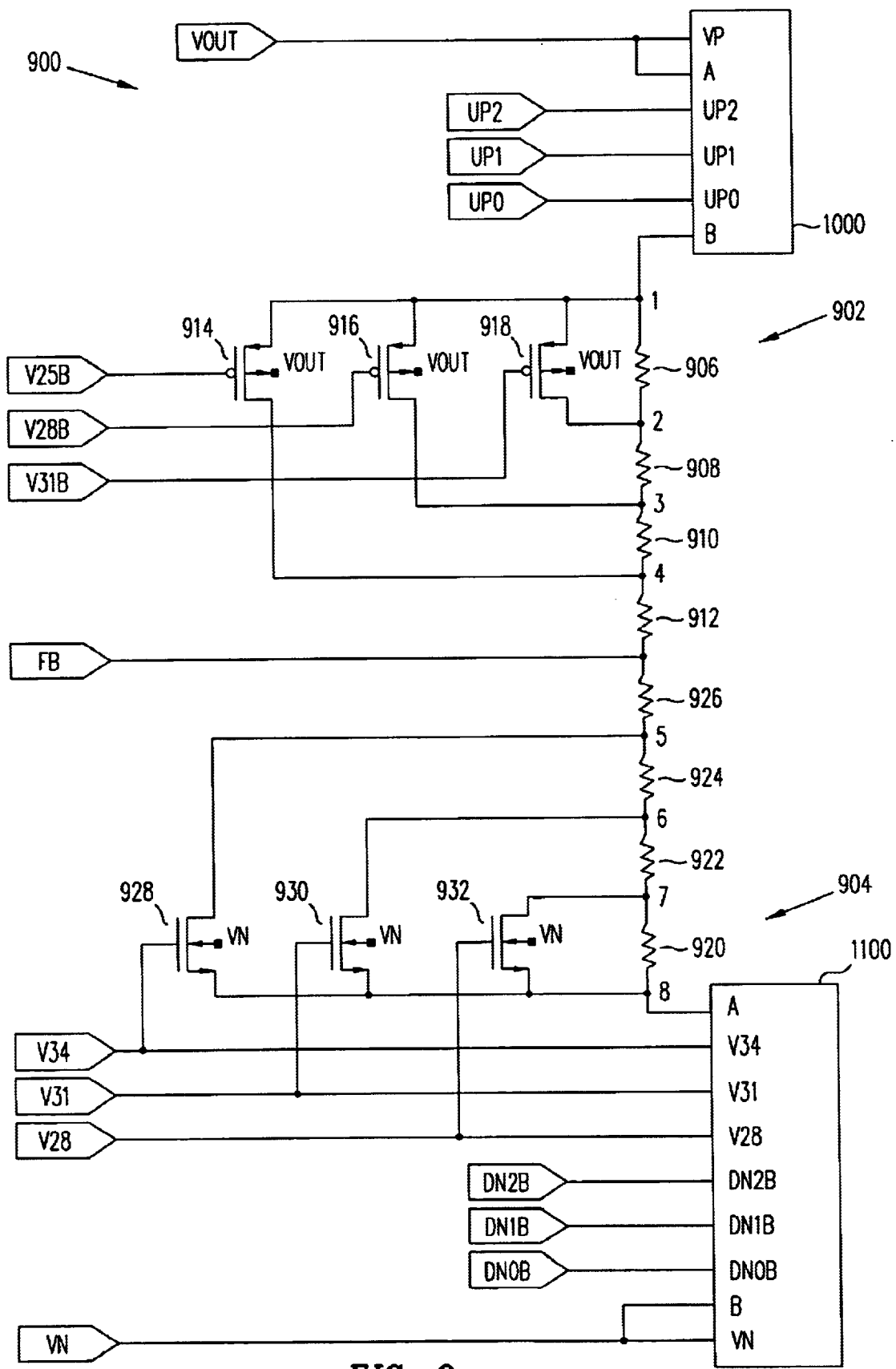
FIG. 9 is a diagram of a resistor divider circuit.

The down adjustment signals (DN0B, DN1B, and DN2B), up adjustment signals (UP0, UP1, and UP2), and output voltage selection signals (V34B/V34, V31B/V31, V28B/V28, and V25B/V25) can be used, for example, to control a feedback signal to amplifier 108 by adjusting upper resistance 902 and lower resistance 904 of FIG. 1B. FIG. 9 is a diagram of resistor divider circuit 900. Resistor divider circuit 900 uses the signals to adjust the value of upper resistance 902 between the VOUT pin and a divider node FB, and to adjust the value of lower resistance 904 between divider node FB and a negative reference (VN), which may be the GND pin (see FIG. 1B).

In FIG. 9, the VOUT pin is coupled to two inputs (VP and A) of an upper resistance trim circuit 1000, discussed in more detail below (see FIG. 10). Up adjustment signals UP0, UP1, and UP2 are coupled to corresponding inputs of resistance trim circuit 1000 to control the equivalent resistance of resistance trim circuit 1000. Upper resistance 902 includes the equivalent resistance of upper resistance trim circuit 1000 (measured between input A and output B) serially-coupled to a plurality of serially-coupled resistors (four in this embodiment) 906, 908, 910, and 912. Output B of resistance trim circuit 1000 is coupled to one terminal of resistor 906 at node 1. One terminal of resistor 912 is coupled to divider node FB.

A plurality (three in this embodiment) of p-type MOSFETs 914, 916, and 918 include sources coupled to output B of resistance trim circuit 1000 at node 1. The bodies of MOSFETs 914, 916, and 918 are coupled to the VOUT pin. The drains of MOSFETs 914, 916, and 918 are respectively coupled to nodes 4, 3, and 2 between resistor pairs 910/912, 908/910, and 906/908. The gates of MOSFETs 914, 916, and 918 are respectively controlled by output voltage selection signals V25B, V28B, and V31B.

Each of MOSFETs 914, 916, and 918 acts to short out one or more of resistors 906, 908, 910, and 912, based on which output voltage is selected. For example, if the 2.8V output voltage is selected, the signal pair V28B/V28 would have values of 0/1, while all other pairs would have values of 1/0. A zero (i.e., low) value V28B signal would turn on MOSFET 916, shorting node 1 to node 3, making the equivalent resistance of upper resistance 902 equal to the sum of the equivalent resistance of resistance trim circuit 1000 plus the sum of resistors 910 and 912.

The equivalent resistance of lower resistance 904 is determined similarly to upper resistance 902. Negative reference VN, which may be the GND pin, is coupled to two inputs (VN and B) of a lower resistance trim circuit 1100, discussed in more detail below (see FIG. 11). Down adjustment signals DN0B, DN1B, and DN2B and output voltage selection signals V34, V31, and V28 are coupled to corresponding inputs of resistance trim circuit 1100 to control the equivalent resistance of resistance trim circuit 1100. Lower resistance 904 includes the equivalent resistance of lower resistance trim circuit 1100 (measured between input A and output B) serially-coupled to a plurality of serially-coupled resistors (four in this embodiment) 920, 922, 924, and 926. Input A of resistance trim circuit 1000 is coupled to one terminal of resistor 920 at node 8. One terminal of resistor 926 is coupled to divider node FB.

A plurality (three in this embodiment) of n-type MOSFETs 928, 930, and 932 include sources coupled to input A of resistance trim circuit 1100 at node 8. The bodies of MOSFETs 928, 930, and 932 are coupled to negative reference VN. The drains of MOSFETs 928, 930, and 932 are respectively coupled to nodes 5, 6, and 7 between resistor pairs 924/926, 922/924, and 920/922. The gates of MOSFETs 928, 930, and 932 are respectively controlled by output voltage selection signals V34, V31, and V28. Like MOSFETs 914, 916, and 918, each of MOSFETs 928, 930, and 932 acts to short out one or more of resistors 920, 922, 924, and 926, based on which output voltage is selected, to modify the equivalent resistance of lower resistance 904.

Figure 10:
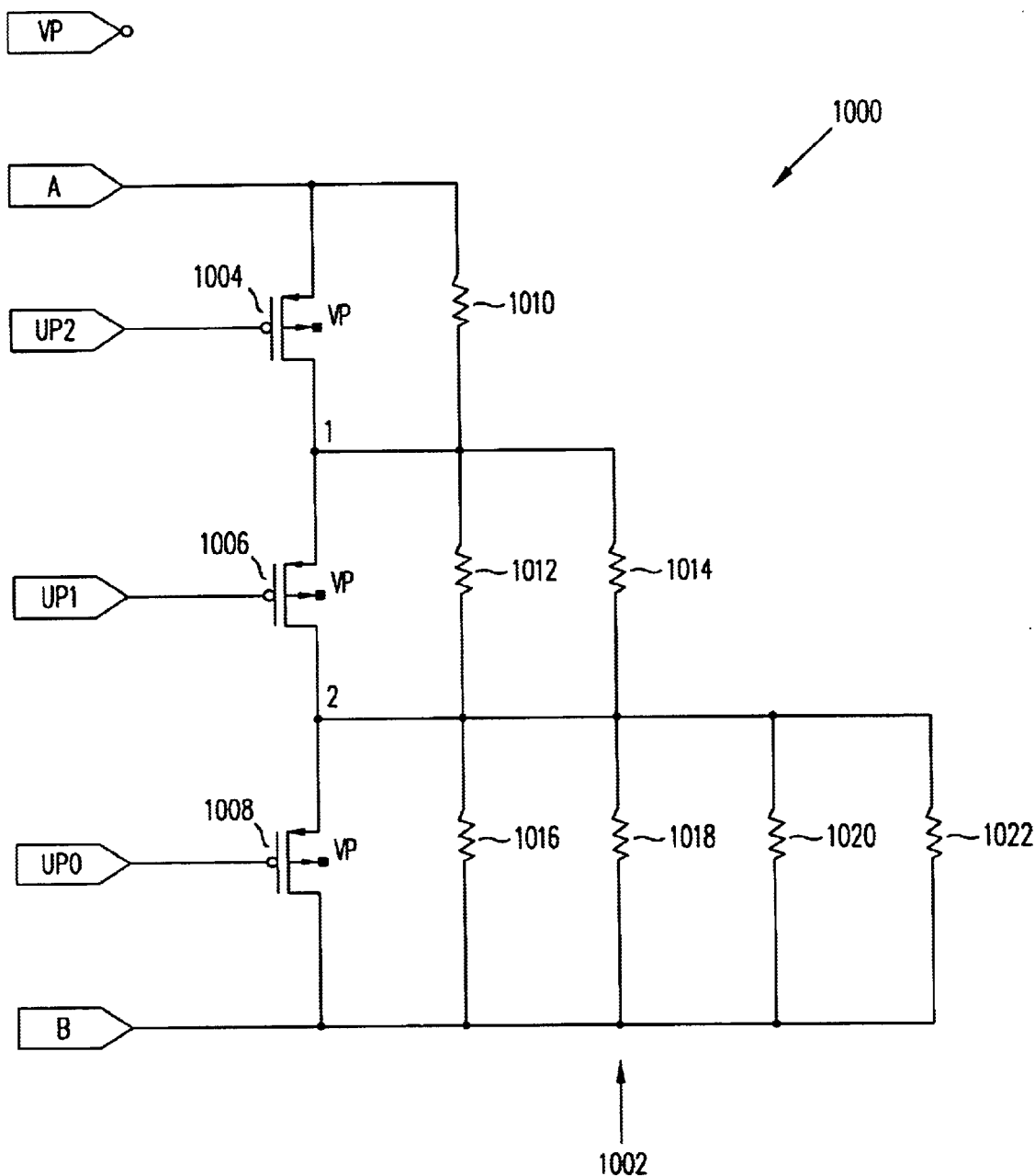
FIG. 10 is a diagram of an upper resistance trim circuit.

FIG. 10 is a diagram of an embodiment of upper resistance trim circuit 1000. Resistance trim circuit 1000 includes a binarily-weighted resistor network 1002 that can be modified by a plurality (three in this embodiment) of serially-coupled p-type MOSFETs 1004, 1006, and 1008. The source of MOSFET 1004 is coupled to input A of resistance trim circuit 1000. The drain of MOSFET 1004 is coupled to the source of MOSFET 1006 at node 1. The drain of MOSFET 1006 is coupled to the source of MOSFET 1008 at node 2. The drain of MOSFET 1008 is coupled to output B of resistance trim circuit 1000. The bodies of MOSFETs 1004, 1006, and 1008 are coupled to positive reference VP. The gates of MOSFETs 1004, 1006, and 1008 are respectively controlled by up adjustment signals UP2, UP1, and UP0.

A resistor 1010 is coupled between input A and node 1. A plurality (two in this embodiment) of resistors 1012 and 1014 are coupled in parallel between node 1 and node 2. A plurality (four in this embodiment) of resistors 1016, 1018, 1020, and 1022 are coupled in parallel between node 2 and output B. If, for example, each of the resistors has a value of R, the equivalent resistance between input A and node 1 is R, between nodes 1 and 2 is R/2, and between node 2 and output B is R/4 (ignoring MOSFETs 1004, 1006, and 1008).

Each of MOSFETs 1004, 1006, and 1008 acts to short out the resistors between two nodes when low up adjustment signals UP2, UP1, and UP0 are applied at the respective gates of MOSFETs 1004, 1006, and 1008. Any number of the up adjustment signals, including none of them, may have a low value. Table 1 summarizes the equivalent resistance ($R_{AB}$) between input A and output B of upper resistance trim circuit 1000 for possible combinations of up adjustment signals UP0, UP1, and UP2. As discussed above in reference to FIG. 8, the up adjustment signals UP0, UP1, and UP2 are the inverted output signals outb3, outb4, and outb5 (denoted outb3b, outb4b, and outb5b in Table 1) from zener bit circuits 600D, 600E, and 600F, respectively, of FIG. 4.

TABLE 1

| Equivalent Resistance, $R_{AB}$, of Upper Resistance Trim Circuit 1000 | | | |
|---|---|---|---|
| UP0 outb3b | UP1 outb4b | UP2 outb5b | $R_{AB}$ |
| 1 | 1 | 1 | 7/4 R |
| 1 | 1 | 0 | 3/4 R |
| 1 | 0 | 1 | 5/4 R |
| 1 | 0 | 0 | 1/4 R |
| 0 | 1 | 1 | 3/2 R |
| 0 | 1 | 0 | 1/2 R |
| 0 | 0 | 1 | R |
| 0 | 0 | 0 | 0 |

Figure 11:
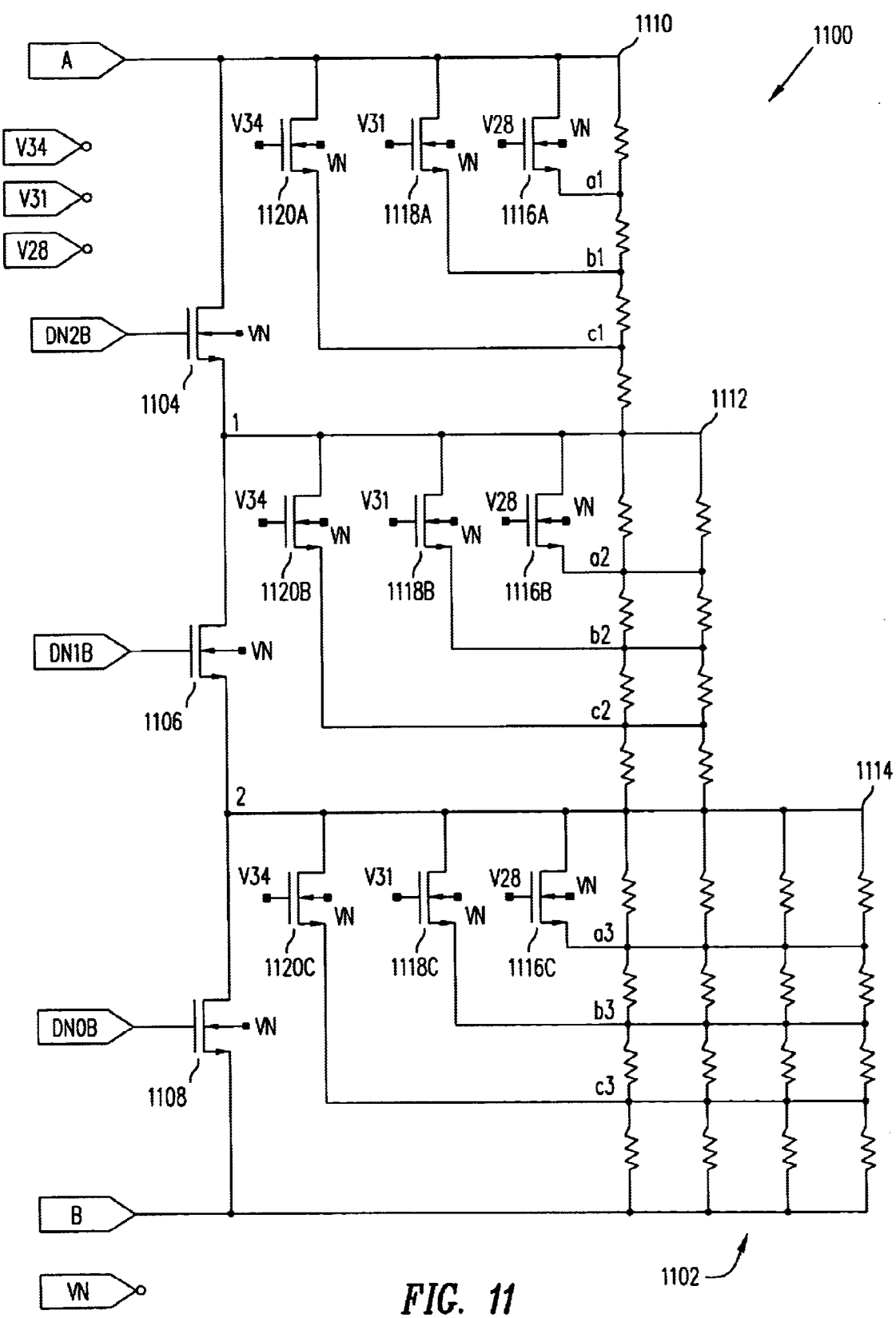
FIG. 11 is a diagram of a lower resistance trim circuit.

FIG. 11 is a diagram of an embodiment of lower resistance trim circuit 1100. Lower resistance trim circuit 1100 is similar to upper resistance trim network 1000 in that a binarily-weighted resistor network 1102 can be modified by a plurality (three in this embodiment) of serially-coupled n-type MOSFETs 1104, 1106, and 1108. The gates of MOSFETs 1104, 1106, and 1108 are respectively controlled by the down adjustment signals DN2B, DN1B, and DN0B. The bodies of MOSFETs 1104, 1106, and 1108 are coupled to negative reference VN.

Unlike upper resistance trim circuit 1000, however, each of the three resistances controlled by MOSFETs 1104, 1106, and 1108 is further divided into a plurality (four in this embodiment) of sub-resistances. A resistance 1110 controlled by MOSFET 1104 is divided into a series connection of four single resistors. A resistance 1112 controlled by MOSFET 1106 is divided into a series connection of four pairs of parallel-connected resistors. A resistance 1114 controlled by MOSFET 1108 is divided into a series connection of four sets of four parallel-connected resistors.

In this embodiment, three sets of three n-type MOSFETs act to short out the sub-resistances, based on which output voltage is selected. For example, when the 2.8V output voltage is selected, output voltage selection signal V28 is high. MOSFETs 1116A, 116B, and 1116C, with gates controlled by voltage selection signal V28, turn on and short out the respective sub-resistances between input A and node a1, node 1 and node a2, and node 2 and node a3. Similarly, MOSFETs 1118A, 1118B, and 1118C short out the respective sub-resistances between input A and node b1, node 1 and node b2, and node 2 and node b3 when the 3.1V output voltage is selected. Similarly, MOSFETs 1120A, 1120B, and 1120C short out the respective sub-resistances between input A and node c1, node 1 and node c2, and node 2 and node c3 when the 3.4V output voltage is selected.

Table 2 summarizes the equivalent resistance ($R_{AB}$) between input A and output B of lower resistance trim circuit 1100 for possible combinations of down adjustment signals DN0B, DN1B, and DN2B for each output voltage selection. The values in Table 2 assume each resistor in lower resistance trim circuit 1100 has a value of R. As discussed above in reference to FIG. 8, the down adjustment signals DN0B, DN1B, and DN2B are the output signals outb0, outb1, and outb2 from zener bit circuits 600A, 600B, and 600C, respectively, of FIG. 4.

TABLE 2

Equivalent Resistance, $R_{AB}$, of Lower Resistance Trim Circuit 1100

| DN0B outb0 | DN1B outb1 | DN2B outb2 | V25 = 1 $R_{AB}$ | V28 = 1 $R_{AB}$ | V31 = 1 $R_{AB}$ | V34 = 1 $R_{AB}$ |
|---|---|---|---|---|---|---|
| 0 | 0 | 0 | 7 R | 21/4 R | 7/2 R | 7/4 R |
| 0 | 0 | 1 | 3 R | 9/4 R | 3/2 R | 3/4 R |
| 0 | 1 | 0 | 5 R | 15/4 R | 5/2 R | 5/4 R |
| 0 | 1 | 1 | 1 R | 3/4 R | 1/2 R | 1/4 R |
| 1 | 0 | 0 | 6 R | 18/4 R | 6/2 R | 3/2 R |
| 1 | 0 | 1 | 2 R | 6/4 R | 2/2 R | 1/2 R |
| 1 | 1 | 0 | 4 R | 12/4 R | 4/2 R | R |
| 1 | 1 | 1 | 0 | 0 | 0 | 0 |

In accordance with the present invention, in practice, a packaged analog integrated circuit (e.g., packaged linear regulator 100 of FIG. 1A) is tested and then trimmed according to a trim table. This is possible since the package includes the analog integrated circuit (e.g., linear regulator circuit 102 of FIG. 1B) coupled to a trimming circuit (e.g., circuit 1200 of FIG. 12), which is also in the package. Table 3 summarizes the constant output voltage values resulting from trimming a particular five-pin linear regulator for possible combinations of the output signals outb0 through outb7 of zener bit circuits 600A through 700H, respectively, of FIG. 4. In Table 3, the nominal output voltage values of 2.5V, 2.8V, 3.1V, and 3.45V (which correspond to values of outb7 and outb6 of 00, 01, 10, and 11, respectively) are shown for the 000000 values of outb5 through outb0.

The post-package trimming technique of the present invention can thus be used to take a plurality of programming data, program a plurality of storage devices, and modify the normal operation of an integrated circuit, such as a linear regulator. By performing the trimming after packaging of the die, the technique saves costs and avoids the detrimental effects of package shift. The foregoing embodiments are intended to be illustrative and not limiting of the broad principles of this invention. Many additional embodiments will be apparent to persons skilled in the art. The invention is limited only by the following claims.

TABLE 3

Output Voltage Values of Trimmed Five-Pin Linear Voltage Regulator

| | outb7-outb6 | | | |
|---|---|---|---|---|
| outb5-outb0 | 00 | 01 | 10 | 11 |
| 000111 | 2.314 | 2.586 | 2.870 | 3.182 |
| 000110 | 2.337 | 2.613 | 2.900 | 3.216 |
| 000101 | 2.362 | 2.641 | 2.930 | 3.252 |
| 000100 | 2.387 | 2.671 | 2.962 | 3.288 |
| 000011 | 2.415 | 2.701 | 2.995 | 3.326 |
| 000010 | 2.443 | 2.733 | 3.029 | 3.366 |
| 000001 | 2.473 | 2.767 | 3.065 | 3.407 |
| 000000 | 2.504 | 2.802 | 3.102 | 3.450 |
| 001000 | 2.533 | 2.834 | 3.138 | 3.490 |
| 010000 | 2.563 | 2.867 | 3.175 | 3.531 |
| 011000 | 2.591 | 2.900 | 3.211 | 3.571 |
| 100000 | 2.623 | 2.935 | 3.249 | 3.614 |
| 101000 | 2.651 | 2.967 | 3.285 | 3.654 |
| 110000 | 2.681 | 3.001 | 3.322 | 3.696 |
| 111000 | 2.710 | 3.033 | 3.358 | 3.736 |

I claim:

1. A circuit arrangement for post-package trimming, comprising:

a test mode input circuit configured to identify a test mode operation and to generate a test mode signal;

a register control circuit coupled to said test mode input circuit and configured to generate a data signal and a plurality of control signals during said test mode operation;

a register circuit comprising at least one bit circuit including a storage device and a shift register bit latch, said register circuit coupled to said register control circuit to receive said data signal and said control signals and said register circuit configured to supply said data signal and said control signals to said at least one bit circuit to program said storage device and to generate a plurality of trim control signals;

a program voltage sense circuit coupled to said register circuit and configured to sense a program voltage; and a trim control circuit coupled to said register circuit and configured to apply said trim control signals.

2. The circuit arrangement of claim 1, wherein said register circuit further comprises a plurality of said bit circuits each including a storage device and a shift register bit latch including an input and an output, said bit circuits being serially-coupled.

3. The circuit arrangement of claim 2, wherein said input of said shift register bit latch of a first of said bit circuits is coupled to receive said data signal, and each of said inputs of said shift register bit latches of a rest of said bit circuits is coupled to said output of said shift register bit latch of a preceding bit circuit.

4. The circuit arrangement of claim 1, wherein said at least one bit circuit further includes:

an input of said shift register bit latch coupled to receive said data signal;

a NAND gate including a first input, a second input, and an output, wherein said first input is coupled to an output of said shift register bit latch, and said second input is coupled to receive a program enable signal; and a storage device circuit including said storage device, wherein said storage device circuit is coupled to said output of said NAND gate to receive a program signal.

5. The circuit arrangement of claim 4, wherein said at least one bit circuit further includes an output shift register bit latch with an input coupled to an output of said storage device circuit.

6. The circuit arrangement of claim 4, wherein said storage device circuit further includes:

a current source including a first terminal and a second terminal, wherein said first terminal is coupled to an input voltage pin;

a first MOSFET including a gate, a first terminal, a second terminal, and a body, wherein said gate of said first MOSFET is coupled to receive a reference voltage, said first terminal of said first MOSFET is coupled to said second terminal of said current source, and said body of said first MOSFET is coupled to one of a ground pin or a power pin; and a zener diode including a cathode and an anode, wherein said anode of said zener diode is coupled to said ground pin, and said cathode of said zener diode is coupled to said second terminal of said first MOSFET.

7. The circuit arrangement of claim 6, wherein said storage device circuit further includes:

a p-type MOSFET including a gate, a drain, a source, and a body, wherein said gate is coupled to receive said program signal, said source and said body are coupled to said input voltage pin, and said drain is coupled to said cathode of said zener diode;

a NOR gate including a first input, a second input, and an output, wherein said first input is coupled to receive an enable signal, and said second input is coupled to said first terminal of said first MOSFET; and an inverter including an input and an output, wherein said input of said inverter is coupled to said output of said NOR gate, and said output of said inverter supplies one of said plurality of trim control signals.

8. The circuit arrangement of claim 7, wherein said first MOSFET comprises an n-type MOSFET including a gate, a drain, a source, and a body, wherein said drain of said n-type MOSFET comprises said first terminal of said first MOSFET and said source of said n-type MOSFET comprises said second terminal of said first MOSFET.

9. The circuit arrangement of claim 6, wherein said current source comprises a p-type MOSFET including a drain, a gate, a source, and a body, wherein said source and said body of said p-type MOSFET comprise said first terminal of said current source, said drain of said p-type MOSFET comprises said second terminal of said current source, and said gate of said p-type MOSFET is coupled to receive a biasing signal so that said p-type MOSFET is biased to provide a constant current.

10. The circuit arrangement of claim 1, wherein said test mode input circuit comprises:

a p-type MOSFET including a gate, a source, a body, and a drain, wherein said gate of said p-type MOSFET is coupled to an input voltage pin, and said source and said body are coupled to an enable pin;

a resistor coupled between said drain of said p-type MOSFET and a ground pin; and a Schmidt trigger coupled to said drain of said p-type MOSFET, said Schmidt trigger generating said test mode signal.

11. The circuit arrangement of claim 1, wherein said register control circuit comprises:

a first NAND gate including a first input, a second input, and an output, wherein said first input of said first NAND gate is coupled to receive said test mode signal, and said second input of said first NAND gate is coupled to receive an clock input signal;

a first inverter including an input and an output, wherein said input of said first inverter is coupled to said output of said first NAND gate, and said output of said first inverter supplies a clock signal;

a second inverter including an input and an output, wherein said input of said second inverter is coupled to said output of said first inverter, and said output of said second inverter supplies an inverted clock signal;

a second NAND gate including a first input, a second input, and an output, wherein said first input of said second NAND gate is coupled to receive said test mode signal, and said second input of said second NAND gate is coupled to receive a data input signal from an output voltage pin;

a third inverter including an input and an output, wherein said input of said third inverter is coupled to said output of said second NAND gate, and said output of said third inverter supplies said data signal;

a rising edge detector including an input and an output, wherein said input of said rising edge detector is coupled to receive said test mode signal, and said output of said rising edge detector supplies a load signal; and a fourth inverter including an input and an output, wherein said input of said fourth inverter is coupled to said output of said rising edge detector, and said output of said inverter supplies an inverted load signal.

12. The circuit arrangement of claim 1, wherein said program voltage sense circuit comprises:

a first p-type MOSFET including a gate, a drain, a source, and a body, wherein said gate of said first p-type MOSFET is coupled to receive an inverted enable signal, and said source and said body of said first p-type MOSFET are coupled to an input voltage pin;

a first inverter including an input and an output, wherein said input of said first inverter is coupled to said gate of said first p-type MOSFET;

a second p-type MOSFET including a gate, a drain, a source, and a body, wherein said gate of said second p-type MOSFET is coupled to said output of said first inverter, and said source and said body of said second p-type MOSFET are coupled to said input voltage pin;

a plurality of serially-coupled diode-connected p-type MOSFETs each including a gate, a drain, a source, and a body, wherein a source of a first of said plurality of serially-coupled diode-connected p-type MOSFETs is coupled to said drain of said first p-type MOSFET;

a first n-type MOSFET including a gate, a drain, a source, and a body, wherein said gate of said first n-type MOSFET is coupled to said drain of said first n-type MOSFET, thereby forming a diode connection, said source and said body of said first n-type MOSFET are coupled to a ground pin, and said drain of said first n-type MOSFET is coupled to a drain of a last of said plurality of serially-coupled diode-connected p-type MOSFETs;

a second n-type MOSFET including a gate, a drain, a source, and a body, wherein said gate of said third n-type MOSFET is coupled to receive an inverted enable signal, said drain of said third n-type MOSFET is coupled to said drain of said first n-type MOSFET, and said source and said body of said third n-type MOSFET are coupled to said ground pin;

a third n-type MOSFET including a gate, a drain, a source, and a body, wherein said gate of said fourth n-type MOSFET is coupled to said drain of said first n-type MOSFET, said drain of said fourth n-type MOSFET is coupled to said drain of said second p-type MOSFET, and said source and said body of said fourth n-type MOSFET are coupled to said ground pin;

a current source including a first terminal and a second terminal, wherein said first terminal of said current source is coupled to said input voltage pin and said second terminal of said current source is coupled to said drain of said fourth n-type MOSFET;

a Schmidt trigger including and input and an output, wherein said input of said Schmidt trigger is coupled to said drain of said fourth n-type MOSFET and to said drain of said second p-type MOSFET; and a second inverter including an input and an output, wherein said input of said inverter is coupled to said output of said Schmidt trigger, and said output supplies a program enable signal.

13. The circuit arrangement of claim 12, wherein said plurality of serially-coupled diode-connected p-type MOSFETs comprises five serially-coupled diode-connected p-type MOSFETs.

14. The circuit arrangement of claim 1, wherein said trim control circuit comprises:

at least a first pair of serially-coupled inverters including an input and an output, wherein said input of said first pair is coupled to a first trim control signal, and said output of said first pair supplies a first down adjustment signal; and at least a first inverter including an input and an output, wherein said input of said first inverter is coupled to a second trim control signal, and said output of said first inverter supplies a first up adjustment signal.

15. The circuit arrangement of claim 14, wherein said trim control circuit further comprises:

a second inverter including an input and an output, wherein said input of said second inverter is coupled to a third trim control signal;

a third inverter including an input and an output, wherein said input of said third inverter is coupled to an fourth trim control signal;

a first NAND gate including a first input, a second input, and an output, wherein said first input of said first NAND gate is coupled to said output of said second inverter, said second input of said first NAND gate is coupled to said output of said third inverter, and said output supplies an inverted first voltage selection signal;

a fourth inverter including an input and an output, wherein said input of said fourth inverter is coupled to said output of said first NAND gate, and said output of said fourth inverter supplies a first voltage selection signal;

a second NAND gate including a first input, a second input, and an output, wherein said first input of said second NAND gate is coupled to receive said third trim control signal, said second input of said second NAND gate is coupled to said output of said third inverter, and said output supplies an inverted second voltage selection signal;

a fifth inverter including an input and an output, wherein said input of said fifth inverter is coupled to said output of said second NAND gate, and said output of said fifth inverter supplies a second voltage selection signal;

a third NAND gate including a first input, a second input, and an output, wherein said first input of said third NAND gate is coupled to said output of said second inverter, said second input of said second NAND gate is coupled to receive said fourth trim control signal, and said output supplies an inverted third voltage selection signal;

an sixth inverter including an input and an output, wherein said input of said sixth inverter is coupled to said output of said third NAND gate, and said output of said sixth inverter supplies a third voltage selection signal;

a fourth NAND gate including a first input, a second input, and an output, wherein said first input of said fourth NAND gate is coupled to receive said third trim control signal, said second input of said second NAND gate is coupled to receive said fourth trim control signal, and said output supplies an inverted fourth voltage selection signal; and a seventh inverter including an input and an output, wherein said input of said seventh inverter is coupled to said output of said fourth NAND gate, and said output of said seventh inverter supplies a fourth voltage selection signal.

16. The circuit arrangement of claim 1, wherein said storage device comprises an EPROM cell.

17. The circuit arrangement of claim 1, wherein said storage device comprises an EEPROM cell.

18. A combination comprising said circuit arrangement of claim 1 and an analog integrated circuit.

19. The combination of claim 18, wherein said analog integrated circuit comprises a linear regulator.

20. The combination of claim 18, wherein said circuit arrangement and said analog integrated circuit are included in a same package.

21. The combination of claim 20, wherein said analog integrated circuit comprises a linear regulator.

22. A method of trimming an analog integrated circuit after packaging, comprising:

providing a packaged integrated circuit;

establishing a test mode operation of said packaged integrated circuit;

receiving a plurality of input data during said test mode operation;

programming a plurality of storage devices based on said input data;

generating a plurality of trim control signals based on the states of said storage devices;

applying said trim control signals; and modifying a normal operation of said packaged integrated circuit.

23. The method of claim 22, further comprising sensing a program voltage during said test mode operation.

24. The method of claim 22, wherein said establishing a test mode operation comprises:

reassigning a normal operation pin assignment to a test mode operation pin assignment; and raising an enable voltage at least one threshold voltage magnitude above an input voltage.

25. The method of claim 22, wherein said receiving a plurality of input data comprises loading said plurality of input data into an input shift register.

26. The method of claim 22, wherein said programming a plurality of storage devices comprises:

deciding whether to program a first state or a second state based on said input data;

short-circuiting a zener diode to program said first state; and leaving said zener diode untouched to program said second state.

27. The method of claim 26, wherein said short-circuiting a zener diode comprises:

applying a high programming voltage; and allowing a high programming current to flow.

28. The method of claim 22, wherein said modifying a normal operation comprises selecting an output voltage for use during said normal operation.

29. The method of claim 22, wherein said providing a packaged integrated circuit comprises providing a linear regulator circuit coupled to a trimming circuitry, said linear regulator circuit and said trimming circuitry being packaged together in a single package.

30. The method of claim 22, wherein said providing a packaged integrated circuit comprises providing a five-pin linear regulator circuit coupled to a trimming circuitry, said five-pin linear regulator circuit and said trimming circuitry being packaged together in a single package.

* * * * *